(12) United States Patent
Henzen

(10) Patent No.: US 11,842,671 B2
(45) Date of Patent: Dec. 12, 2023

(54) SPREAD-SPECTRUM VIDEO TRANSPORT SOURCE DRIVER INTEGRATION WITH DISPLAY PANEL

(71) Applicant: HYPHY USA INC., San Jose, CA (US)

(72) Inventor: Alex Henzen, Bladel (NL)

(73) Assignee: HYPHY USA INC., San Jose, CA (US)

(*) Notice: Subject to any disclaimer, the term of this patent is extended or adjusted under 35 U.S.C. 154(b) by 0 days.

(21) Appl. No.: 18/117,288

(22) Filed: Mar. 3, 2023

(65) Prior Publication Data
US 2023/0290296 A1    Sep. 14, 2023

Related U.S. Application Data

(60) Provisional application No. 63/346,064, filed on May 26, 2022, provisional application No. 63/317,336, filed on Mar. 7, 2022.

(51) Int. Cl.
*G09G 3/36* (2006.01)
*G09G 3/30* (2006.01)
(Continued)

(52) U.S. Cl.
CPC ............ *G09G 3/2096* (2013.01); *H03M 1/66* (2013.01); *G09G 2310/027* (2013.01);
(Continued)

(58) Field of Classification Search
CPC ........... G09G 3/2096; G09G 2310/027; G09G 2310/0289; G09G 2330/021; G09G 2360/08; H03M 1/66
See application file for complete search history.

(56) References Cited

U.S. PATENT DOCUMENTS 3,204,035 A   8/1965   Ballard et al.
3,795,765 A   3/1974   DeGroat et al.
(Continued)

FOREIGN PATENT DOCUMENTS

CN    101933277    12/2010
CN    101969319    2/2011
(Continued)

OTHER PUBLICATIONS

Eltokhy et al., "A Low Power Analog Matched-Filter with Smart Sliding Correlation", IEEJ Trans., EIS, vol. 123, No. 11, 2003, pp. 1970-1976.
(Continued)

*Primary Examiner* — Sanghyuk Park
(74) *Attorney, Agent, or Firm* — Beyer Law Group LLP

(57) ABSTRACT

A video display unit includes a display panel with gate drivers and source drivers. Each of the source drivers receives an encoded analog signal representing a video stream over a transmission medium and decodes the signal to produce samples for output to the display. Gate driver control signals synchronize the gate drivers with the source drivers. The source drivers are integrated with the display panel glass in part or in whole. Amplifiers and level shifters of each source driver are implemented on the panel glass and the collector and decoder are not. Or, the amplifiers, shifters and collector are implemented on the panel glass and the decoder is not. Or, the amplifiers, shifters, collector and decoder of each source driver are implemented on the panel glass. The source drivers may drive a display of a mobile device. Thin-film transistors are used to implement the source drivers on glass.

44 Claims, 19 Drawing Sheets

(51) Int. Cl.
*G09G 3/20* (2006.01)
*H03M 1/66* (2006.01)

(52) U.S. Cl.
CPC .............. *G09G 2310/0289* (2013.01); *G09G 2310/0291* (2013.01); *G09G 2330/021* (2013.01); *G09G 2360/08* (2013.01)

(56) References Cited

U.S. PATENT DOCUMENTS

| | | | |
|---|---|---|---|
| 5,793,759 | A | 8/1998 | Rakib et al. |
| 5,796,774 | A | 8/1998 | Kato |
| 5,870,414 | A | 2/1999 | Chaib et al. |
| 5,936,997 | A | 8/1999 | Kanda |
| 5,938,787 | A | 8/1999 | Stark et al. |
| 5,956,333 | A | 9/1999 | Zhou et al. |
| 5,966,376 | A | 10/1999 | Rakib et al. |
| 6,018,547 | A | 1/2000 | Arkhipkin |
| 6,128,309 | A | 10/2000 | Tariki et al. |
| 6,154,456 | A | 11/2000 | Rakib et al. |
| 6,289,039 | B1 | 9/2001 | Garodnick |
| 6,310,923 | B1 | 10/2001 | Lee et al. |
| 6,456,607 | B2 | 9/2002 | Aria et al. |
| 6,480,559 | B1 | 11/2002 | Dabak et al. |
| 6,751,247 | B1 | 6/2004 | Zhengdi |
| 6,763,009 | B1 | 7/2004 | Bedekar et al. |
| 6,956,891 | B2 | 10/2005 | Tan et al. |
| 7,710,910 | B2 | 5/2010 | Ode et al. |
| 7,793,022 | B2 | 9/2010 | Travers et al. |
| 7,796,575 | B2 | 9/2010 | Lim et al. |
| 7,873,097 | B1 | 1/2011 | Luecke et al. |
| 7,873,980 | B2 | 1/2011 | Horan et al. |
| 7,908,634 | B2 | 3/2011 | Keady et al. |
| 7,937,605 | B2 | 5/2011 | Rea et al. |
| 7,996,584 | B2 | 8/2011 | Keady et al. |
| 8,073,647 | B2 | 12/2011 | Horan et al. |
| 8,094,700 | B2 | 1/2012 | Okazaki |
| 8,272,023 | B2 | 9/2012 | Horan et al. |
| 8,280,668 | B2 | 10/2012 | Horan et al. |
| 8,295,296 | B2 | 10/2012 | Keady et al. |
| 8,369,794 | B1 | 2/2013 | Bharghavan et al. |
| RE44,199 | E | 5/2013 | Garodnick |
| 8,520,776 | B2 | 8/2013 | Rea et al. |
| 8,546,688 | B2 | 10/2013 | Horan et al. |
| 8,674,223 | B2 | 3/2014 | Horan et al. |
| 8,674,224 | B2 | 3/2014 | Horan et al. |
| 8,674,225 | B2 | 3/2014 | Horan et al. |
| 8,674,226 | B2 | 3/2014 | Horan et al. |
| 8,680,395 | B2 | 3/2014 | Horan et al. |
| 8,705,588 | B2 | 4/2014 | Odenwalder |
| 9,324,478 | B2 | 4/2016 | Horan et al. |
| 9,970,768 | B2 | 5/2018 | Monroe et al. |
| 10,158,396 | B2 | 12/2018 | Hannebauer et al. |
| 10,763,914 | B2 | 9/2020 | Hannebauer et al. |
| 11,025,292 | B2 | 6/2021 | Hannebauer et al. |
| 11,394,422 | B2 | 7/2022 | Hannebauer et al. |
| 11,463,125 | B2 | 10/2022 | Hannebauer et al. |
| 11,716,114 | B2 | 8/2023 | Hannebauer |
| 2002/0011996 | A1* | 1/2002 | Inoue ................... G09G 5/006 345/204 |
| 2002/0013926 | A1 | 1/2002 | Kim et al. |
| 2002/0097779 | A1 | 7/2002 | Bang et al. |
| 2003/0139178 | A1 | 7/2003 | Uesugi et al. |
| 2003/0231153 | A1* | 12/2003 | Seong ................... G09G 3/3685 345/88 |
| 2004/0120415 | A1 | 6/2004 | Song et al. |
| 2005/0069020 | A1 | 3/2005 | Lakkis |
| 2008/0084920 | A1 | 4/2008 | Okazaki |
| 2008/0106306 | A1 | 5/2008 | Keady et al. |
| 2010/0013579 | A1 | 1/2010 | Horan et al. |
| 2010/0091990 | A1 | 4/2010 | Etemad et al. |
| 2010/0142723 | A1 | 6/2010 | Bucklen |
| 2010/0321591 | A1 | 12/2010 | Onomatsu |
| 2011/0044409 | A1 | 2/2011 | Yoshimoto et al. |
| 2012/0014464 | A1 | 1/2012 | Eiger et al. |
| 2013/0194284 | A1 | 8/2013 | Bi |
| 2014/0218616 | A1 | 8/2014 | Toba et al. |
| 2015/0014712 | A1 | 1/2015 | Kim et al. |
| 2016/0127087 | A1 | 5/2016 | Feher |
| 2016/0163277 | A1 | 6/2016 | Ludden et al. |
| 2017/0249885 | A1* | 8/2017 | Tamura ................ G09G 3/3225 |
| 2019/0174027 | A1 | 6/2019 | Lv et al. |
| 2019/0260629 | A1 | 8/2019 | Nikopour et al. |
| 2020/0014419 | A1 | 1/2020 | Hannebauer et al. |
| 2020/0388237 | A1 | 12/2020 | Tu et al. |
| 2022/0302953 | A1 | 9/2022 | Hannebauer et al. |
| 2023/0223981 | A1 | 7/2023 | Hannebauer et al. |
| 2023/0230559 | A1 | 7/2023 | Friedman |

FOREIGN PATENT DOCUMENTS

| | | |
|---|---|---|
| CN | 104732944 | 6/2015 |
| CN | 101917209 | 7/2015 |
| EP | 0 727 881 | 8/1996 |
| EP | 1 079 536 | 2/2001 |
| EP | 1 968 324 | 9/2008 |
| JP | 08293818 | 11/1996 |
| JP | H09312590 | 12/1997 |
| JP | 2001-144653 | 5/2001 |
| JP | 2001156861 | 6/2001 |
| JP | 2001510658 | 7/2001 |
| JP | 2002281545 | 9/2002 |
| JP | 2007-150971 | 6/2007 |
| JP | 2011003331 | 6/2011 |
| WO | WO 2017/049347 | 3/1917 |
| WO | WO 97/02663 | 1/1997 |
| WO | WO 98/52365 | 11/1998 |
| WO | 2010/106330 | 9/2010 |
| WO | 2018-170546 | 9/2010 |
| WO | WO 2012/007785 | 1/2012 |

OTHER PUBLICATIONS

Van der Heijden, "An Analog Correlator for a High Speed DS-CDMA Modem", Eindhoven University of Technology, Department of Electrical Engineering Telecommunication Technology and Electromagnetics, 1998, 65 pages.

Shanmugam et al., "An Analog Spread-Spectrum Interface for Power-Line Data Communication in Home Networking", IEEE transactions on Power Delivery, vol. 20, No. 1, Jan. 2005.

Immink, "Construction of DC-free Codes Using the fast Hadamard Transform", Nov. 7, 2001, 6 pages.

International Search Report and Written Opinion dated Jun. 8, 2023 from International Application No. PCT/US2023/014605.

* cited by examiner

FIG. 2  SSVT Receiver Integrated with Source Drivers of Display

SPREAD-SPECTRUM VIDEO TRANSPORT SOURCE DRIVER INTEGRATION WITH DISPLAY PANEL

CROSS-REFERENCE TO RELATED APPLICATIONS

This application claims priority of U.S. provisional patent application No. 63/317,336, filed Mar. 7, 2022, entitled "SPREAD-SPECTRUM VIDEO TRANSPORT SOURCE DRIVER INTEGRATION WITH DISPLAY GLASS" and of U.S. provisional patent application No. 63/346,064, filed May 26, 2022, entitled "SPREAD-SPECTRUM VIDEO TRANSPORT SOURCE DRIVER INTEGRATION WITH DISPLAY GLASS" which are both hereby incorporated by reference.

This application incorporates by reference U.S. application Ser. No. 15/925,123, filed on Mar. 19, 2018, U.S. application Ser. No. 16/494,901 filed on Sep. 17, 2019, U.S. application Ser. No. 17/879,499 filed on Aug. 2, 2022, U.S. application Ser. No. 17/686,790, filed on Mar, 4, 2022, U.S. application Ser. No. 17/887,849 filed on Aug. 15, 2022, U.S. application Ser. No. 17/851,821, filed on Jun. 28, 2022, U.S. application Ser. No. 63/421,062 filed on Oct. 31, 2022, U.S. application Ser. No. 17/900,570 filed on Aug. 31, 2022, U.S. application Ser. No. 17/946,479, filed on Sep. 16, 2022, U.S. application Ser. No. 18/095,801, filed on Jan. 11, 2023, and U.S. application Ser. No. 18/098,612, filed on Jan. 18, 2023.

FIELD OF THE INVENTION

The present invention relates generally to displaying video on a display panel of a display unit. More specifically, the present invention relates to a source driver that is integrated with the display panel.

BACKGROUND OF THE INVENTION

Image sensors, display panels, and video processors are continually racing to achieve larger formats, greater color depth, higher frame rates, and higher resolutions. Local-site video transport includes performance-scaling bottlenecks that throttle throughput and compromise performance while consuming ever more cost and power. Eliminating these bottlenecks can provide advantages.

For instance, with increasing display resolution, the data rate of video information transferred from the video source to the display screen is increasing exponentially: from 3 Gbps a decade ago for full HD, to 160 Gbps for new 8K screens. Typically, a display having a 4K display resolution requires about 18 Gbps of bandwidth at 60 Hz while at 120 Hz 40 Gbps are needed. And, an 8K display requires 80 Gbps at 60 Hz and 160 Gbps at 120 Hz.

Until now, the data is transferred digitally using variants of low-voltage differential signaling (LVDS) data transfer, using bit rates of 16 Gbps per signal pair, and parallelizing the pairs to achieve the required total bit rate. With a wiring delay of 5 ns/m, the wavelength of every bit on the digital connection is 12 mm, which is close to the limit of this type of connection and requires extensive data synchronization to obtain useable data. This digital information then needs to be converted to the analog pixel information on the fly using ultra-fast digital-to-analog (D-to-A) conversion at the source drivers of the display.

Nowadays, D-to-A converters use 8 bits; soon, D-to-A conversion may need 10 or even 12 bits and then it will become very difficult to convert accurately at a fast enough data rate. Thus, displays must do the D-to-A conversion in a very short amount of time, and, the time being available for the conversions is also becoming shorter, resulting in stabilization of the D-to-A conversion also being an issue.

Further, large display architecture nowadays consists of a large area of active matrix display pixels. In early days, display drivers (source and gate) would be mounted at the glass edges, but not on the glass, providing source- and gate-driving circuits. Further integration of the driving electronics onto the glass has stagnated due the complexity of high-speed digital circuits, as well as the large area required for D-to-A conversion. By way of example, digital transport to the source-driving circuits operates at around 3 GHz, a frequency much too high to allow integration onto glass.

Many display drivers have to be attached to the display edge in order to drive a complete, high-resolution LCD or OLED screen. A typical driver has approximately 1,000 outputs, so a typical 4K display requires 4,000×RGB=12,000 connections, meaning twelve source drivers. Increasing the panel resolution to 8K increases this number to 24 source drivers. Data rate, synchronization difficulties and bonding logistics make it difficult to continue in this direction.

Accordingly, new apparatuses and techniques are desirable to integrate the source drivers of a display with the display panel itself.

SUMMARY OF THE INVENTION

To achieve the foregoing, and in accordance with the purpose of the present invention, a source driver of a display panel in a display unit is disclosed that is integrated with the glass of the display panel.

A video signal is a list of brightness values. It is realized that precisely maintaining fixed-bit-width (i.e., digital) brightness values is inefficient for video transport, because voltages offer much greater dynamic range, and there is no requirement for bit-accurate reproduction. Therefore, this disclosure transports display panel video signals as encoded analog signals rather than as digital signals.

Advantages include reducing power consumption. In the prior art, power consumption significantly constrains system performance. Further, embodiments provide noise immunity and EM stealth in that EMI/RFI emissions of a display panel will be well below mandated limits. Yet further, the transmission reach of the encoded analog signal is much greater than that of conventional Ethernet or HDBaseT signals. And, whereas conventional transport uses expensive, mixed-signal processes for high-speed digital circuits, embodiments of the present invention make use of fully depreciated analog processes for greater flexibility and lower production cost.

Prior art source drivers have been mounted at the edge of the display glass panel (but not integrated with it) because of the complexity of high-speed digital circuits, as well as the large area required for D-to-A conversion. The present invention is able to integrate source drivers with the glass itself because no D-to-A converters are required in the source drivers and because of the lower frequency sample transfer of an SSVT signal; e.g., the SSVT video signal arrives at the decoders at a frequency far less than a 3 GHz digital video signal.

The SSVT video signal may be transported along the edge of the display glass using relatively simple wiring, and is insensitive to interference, much unlike existing Vx1 interfaces. The lower sample rate makes it possible to design the required analog electronics (which are far less complex) of the source drivers on the edge of the TFT panel on the display panel glass itself. Building the source driver circuitry on the glass edge allows these circuits to be integrated onto the glass: decoder (directly receiving analog samples via the SSVT signal); staging bank (collects the analog voltages); level shifters and amplifiers (provide the right voltage range and voltage inversion); column drivers (provide the current required to charge the display source lines capacitance).

The invention may be used on any active matrix display substrate. Best suited are substrates with high mobility (e.g., low-temperature poly silicon (LTPS) or oxide (IGZO) TFTs. The resulting display panel can be connected to the GPU by only an arbitrary length of signal cable and a power supply. There is no need for further electronics connected to the glass, providing great opportunity for further edge width reduction and module thinning.

The invention is especially applicable to high resolution, high dynamic range displays used in computer systems, televisions, monitors, machine vision, automotive displays, virtual or augmented reality displays, etcetera.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

Figure 1:
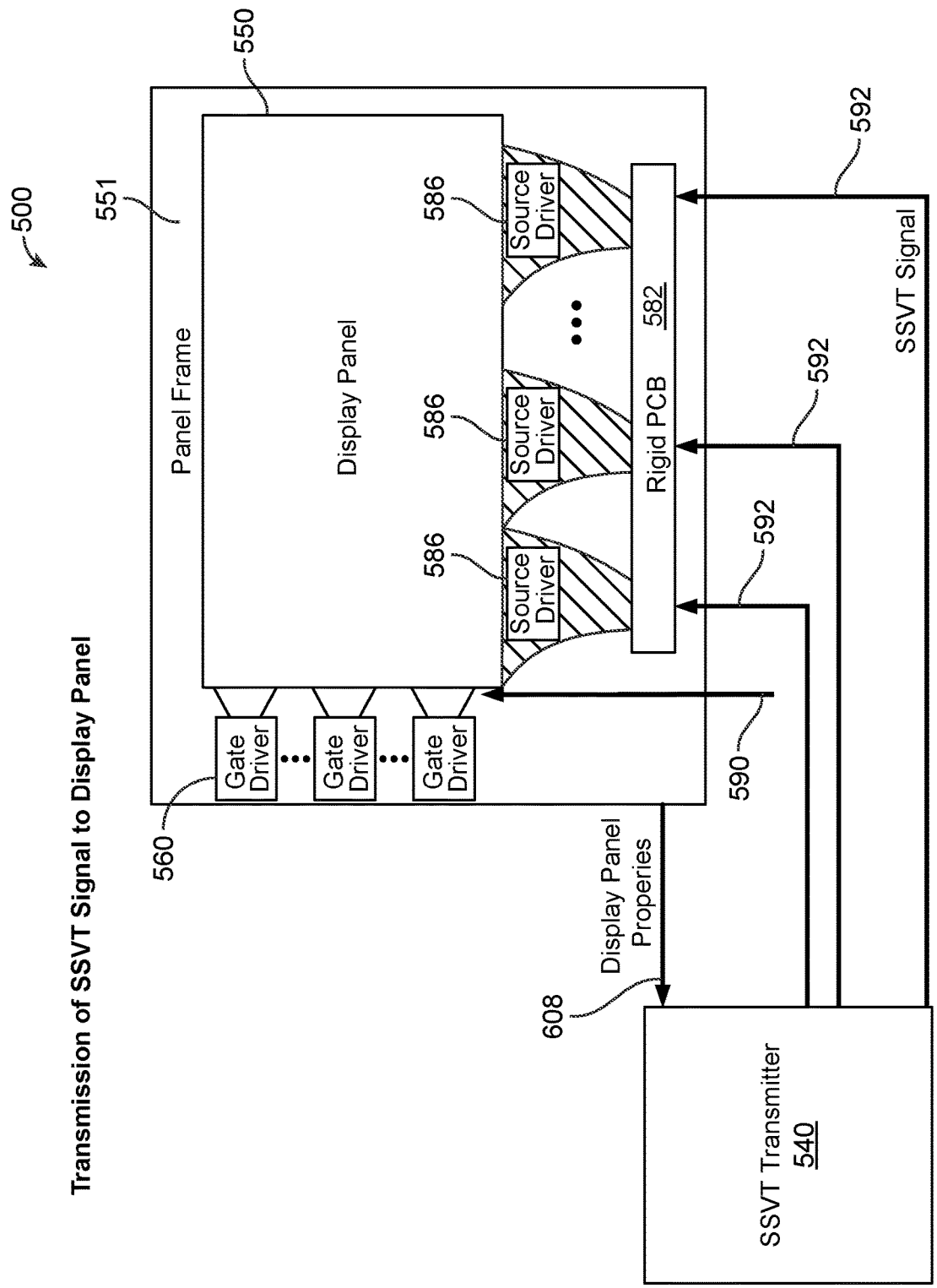
FIG. 1 illustrates delivery of an SSVT analog video signal to a display panel using conversion and encoding within the display unit.

Prior art transport delivers a digital video signal to a display panel within a display unit. For purposes of this disclosure, "display panel" refers to those interior portions of a display unit (often referred to as the "glass") that implement pixels that produce light for viewing, while "display unit" refers to the entire (typically) rectangular enclosure that includes the display panel, a panel assembly, a frame, drivers, cabling, and associated electronics for producing video images. In general, a mass-producible display panel containing $O(N^2)$ pixels is controlled by $O(N)$ voltages, each updated $O(N)$ times per display interval (the inverse of the frame rate.

A digital video signal is typically input to the display unit via an HDMI connector into a system-on-a-chip (SoC) of the display unit; input may also be via an RJ45 connector, etc. The SoC transports the digital signal via a V-by-One HS standard to a display panel, and may also be via MLVDS, DDI, etc. The display unit includes a timing controller (TCON), bit-serial transport (e.g., SerDes, LVDS or CEDS) and any number of DACs (digital-to-analog converters) within the source drivers of the display panel which convert the digital signal into analog for input into pixels of the display panel. A control signal from the SoC to the TCON provides video framing flags (Vsync, Hsync, etc.), configuration parameters, gate driver control signals, FRC grayscale, driver parameter settings, backlight control, contrast control, etc.

In addition to the disadvantages above, this display connectivity digital transport results in higher EMI/RFI concerns due to reliance on high-speed digital circuits, requires high power, is hard to synchronize, and it must be implemented using relatively costly integrated circuit processes. Further, an 8K V-by-One HS requires 48 wire pairs at 3.5 Gbps, for example.

Further, these drawbacks are also present in local-site video connectivity as well as in the display connectivity mentioned above. A GPU generates a video signal that is transported digitally to a display unit (via V-by-One HS, MLVDS, DDI, etc.), where again, DACs within the source drivers convert the signal to analog. Typically, the GPU chip is located on the system/microprocessor board, as close as possible to the microprocessor.

A prior art source driver will typically have 900 to 1,000 outputs, or more, and there are between one and twenty of these source drivers within a typical display unit. Each source driver has a digital portion and an analog portion which includes a DAC. Via buffers, the DAC outputs voltages directly onto the glass of the display, in order to drive the sources of each pixel as is known in the art. A large part of each source driver is used by the digital electronics that require a ten times higher data rate than the associated analog signal to be provided to the column line of the display. This is disadvantageous because the total power consumed by any (digital or analog) circuit is linearly dependent on the switching frequency, usually the clock frequency.

Therefore, it is realized that performing the conversion of the digital video signal from digital to analog as close as possible to the SoC, GPU, or digital video processor will not only eliminate the need for DACs within the source drivers of the display panel but will also realize the above advantages in transporting an analog signal within the display unit instead of a digital signal. And, it is further realized that integrating the novel source drivers of this disclosure (that decode an analog video signal) with the display panel itself yields further advantages.

It is realized that digitization of a video signal takes place at the signal source of the system (often at a GPU) and then the digital signal is transferred, usually using a combination of high performance wiring systems, to the display source drivers, where the digital signal is returned to an analog signal again, to be loaded onto the display pixels. So, the only purpose of the digitization is data transfer from video source to display pixels.

Further it is recognized that it is much easier to perform the D-to-A conversion at the point where less power is needed than at the end point where one must drive the display panel. Thus, instead of transporting a digital signal from the video source all the way to the display panel where an analog signal needs to be generated, we transport an analog signal to the display over a very much lower sample rate than one would normally have with digitization. That means that instead of having to send Gigabits per second over a number of lines, we can now do with only a few mega samples per second in case of the analog signal, thus reducing the bandwidth of the channel that has to be used.

Therefore, we realize that it is beneficial to avoid digitization (to the extent possible) and to transfer the analog signal from a video source to the source drivers, transfer the analog signal from within a display unit to the source drivers, or transfer the analog signal from an intermediate location to the source drivers. This transfer can be done using SSVT encoding, leading to accurate analog voltages to be decoded again at the source drivers. The analog data has high accuracy, so there is no need for high bit depth. This means the sample rate is at least a factor of ten lower than in the case of digital transfer, leaving further bandwidth for expansion. And further, bits in digital data must be well defined, meaning they are sensitive to errors and noise, and one needs to be able to detect the high point and the low point very accurately, whereas, the proposed analog transport is much less sensitive. That means that the quality of the cable (e.g., going from one side to the other in a display unit) does not need to be high.

We further realize that prior art source drivers that input digital signals are located at the edge of the glass of a display panel (but not within the glass), and that the size and complexity of these source drivers (mainly due to their D-to-A converters) prevents integration of these source drivers with the display panel glass. We thus realize that our novel source drivers that decode an analog signal to produce the voltages needed on the display panel, by virtue of their smaller size and complexity, may be integrated with the display glass itself, and we disclose systems and techniques for performing such integration.

Display Connectivity—Conversion Within Display Unit

As mentioned above, a digital video signal may be converted to an analog video signal near the SoC of the display unit. In this embodiment, converting of, and encoding of the digital video signal into an analog SSVT signal occurs within the display unit itself, thus improving display connectivity. The digital video signal is input via an HDMI connector (or RJ45 connector, etc.) to a system-on-a-chip. The digital signal is then transmitted via Vx1 to an integrated circuit in which an SSVT transmitter converts the digital video signal into a spread-spectrum video transport (SSVT) signal which is transported to a display panel. Control signals from the SoC provide gate driver control signals, FRC grayscale, driver parameter settings, backlight control, contrast control, etc., as mentioned above. The display panel has associated an SSVT receiver embedded within the source drivers (implemented as any number of integrated circuits) which then decodes the analog SSVT signal into an analog signal expected by the display panel as will be described in greater detail below. In one embodiment, a display panel driver chipset includes these two integrated circuits.

The advantages of this embodiment are that: that no DACs (digital-to-analog converters) are needed at the display panel; mature IC processes may be used; EMI/RFI emissions are well below mandated limits; only one-half the power is needed; it is easier to synchronize; and an 8K display will only require 8 wire pairs at 1.6 GHz or 18 wire pairs at 680 MHz. By contrast, prior art transport of a digital video signal within a display unit from the system-on-a-chip (SoC) (for example) must be implemented in relatively costly IC processes, EMI/RFI emissions are a concern due to reliance upon high-speed digital circuits, and an 8K/60 Hz display will require 8 wire pairs at 16 Gbps or 36 wire pairs at 3.5 Gbps.

Local Site Video Connectivity—Conversion Outside Display Unit

As mentioned above, a digital video signal may be converted to an analog video signal near a digital video processor of a local-site video system. In this embodiment, converting of, and encoding of the digital video signal into an analog SSVT signal occurs outside of the display unit; input to the display unit is thus the analog SSVT signal. A core AI/ML GPU produces a digital video signal and in which an SSVT transmitter converts the digital signal into an analog signal and encodes it into an SSVT signal which is transported to a display unit and thus to a display panel. The display unit includes an SSVT receiver embedded within the source drivers which then decodes the SSVT signal into an analog signal expected by the display panel as will be described in greater detail below.

The GPU where the video data is processed may be within a computer. Once converted and encoded by the SSVT transmitter the analog signal is transported to the display unit. That display unit may be nearby, 20 meters away, or even farther. Thus, the information path from the graphics or video processor, which may be effectively the computer, goes over a number of transfer connections directly to the display unit without ever being digital anywhere in that data path. Originally, the video signal may begin at a camera or similar device from where it is transported to the GPU. The video signal may also originate at a camera, video processor or internet modem at which location it may also be converted to analog using an SSVT transmitter.

Advantageously, no DACs (digital-to-analog converters) are needed within the display unit. And, the farther upstream of a display unit that we perform the D-to-A conversion and the encoding into an SSVT signal (i.e., not performing the conversion and encoding within the display unit itself), the more benefits we obtain, because we do not need to perform compression to transfer a compressed digital video signal across an HDMI cable. In this particular embodiment, we handle the full resolution display information in the GPU, then perform the conversion and encoding on chip at the GPU, then all the transfer is via a relatively low-frequency SSVT signal until that signal reaches the display unit. In this case, we have handled the entire display resolution at full frame rate from the GPU source to the display unit endpoint without any internal compression.

Display Connectivity Detail

FIG. 1 illustrates delivery of an SSVT video signal to a display panel 550 of a display unit 500. In one embodiment, converting of, and encoding of the digital video signal into an analog SSVT signal occurs within the display unit 500 itself, thus improving display connectivity. Not shown are the SoC and TCON of the display unit. There may be three or more commercial embodiments: a discrete implementation in which the SSVT transmitter is embedded in a mixed-signal integrated circuit and the TCON and SoC are discrete components (the SSVT transmitter is inserted between a legacy TCON and the source drivers described herein); a mixed-implementation in which the SSVT transmitter is integrated with the TCON in a single IC and the SoC is discrete; and a fully-integrated implementation in which as many functions as possible are integrated in a custom mixed-signal integrated circuit (the SSVT transmitter is integrated with the TCON and the SoC).

In this example, the display panel 550 is within a panel frame 551 as shown which is within a 55" HDR 4K60 display unit. Display panel 550 may be a display panel of any size, may be a display or displays within a VR headset, may be a heads-up display (HUD) in which the display is projected onto a windshield, a screen of a visor, etc.

There is a significant advantage to using an SSVT signal internally in a display unit even if the input signal is not SSVT, i.e., it is a digital video signal. In prior art display units, one decompresses the HDMI signal and then one has the full fledged, full bit rate digital data that must then be transferred from the receiving end of the display unit to all locations within the display unit. Those connections can be quite long for a 64- or 80-inch display; one must transfer that digital data from one side of the unit where the input is to the other side where the final display source driver is. Therefore, there is an advantage to converting the digital signal to SSVT internally and then sending that SSVT signal to all locations of the display unit where the source drivers are located. Advantages include it is possible to use lower frequency, lower EMI signals, and the benefit from embedded synchronization/low latency initialization.

Also shown within FIG. 1 is an SSVT transmitter 540 that generates SSVT signals 592 for the source drivers 586. Included are a rigid PCB 582 as well as individual flexible PCBs 584 each holding a source driver 586 which generates source voltages for the display panel. As will be described in greater detail below, signals 608 optionally provide information concerning the display panel back to the transmitter 540 to assist with encoding of the SSVT signal. Below is described how these source drivers 586 may be integrated with that panel glass.

Figure 2:
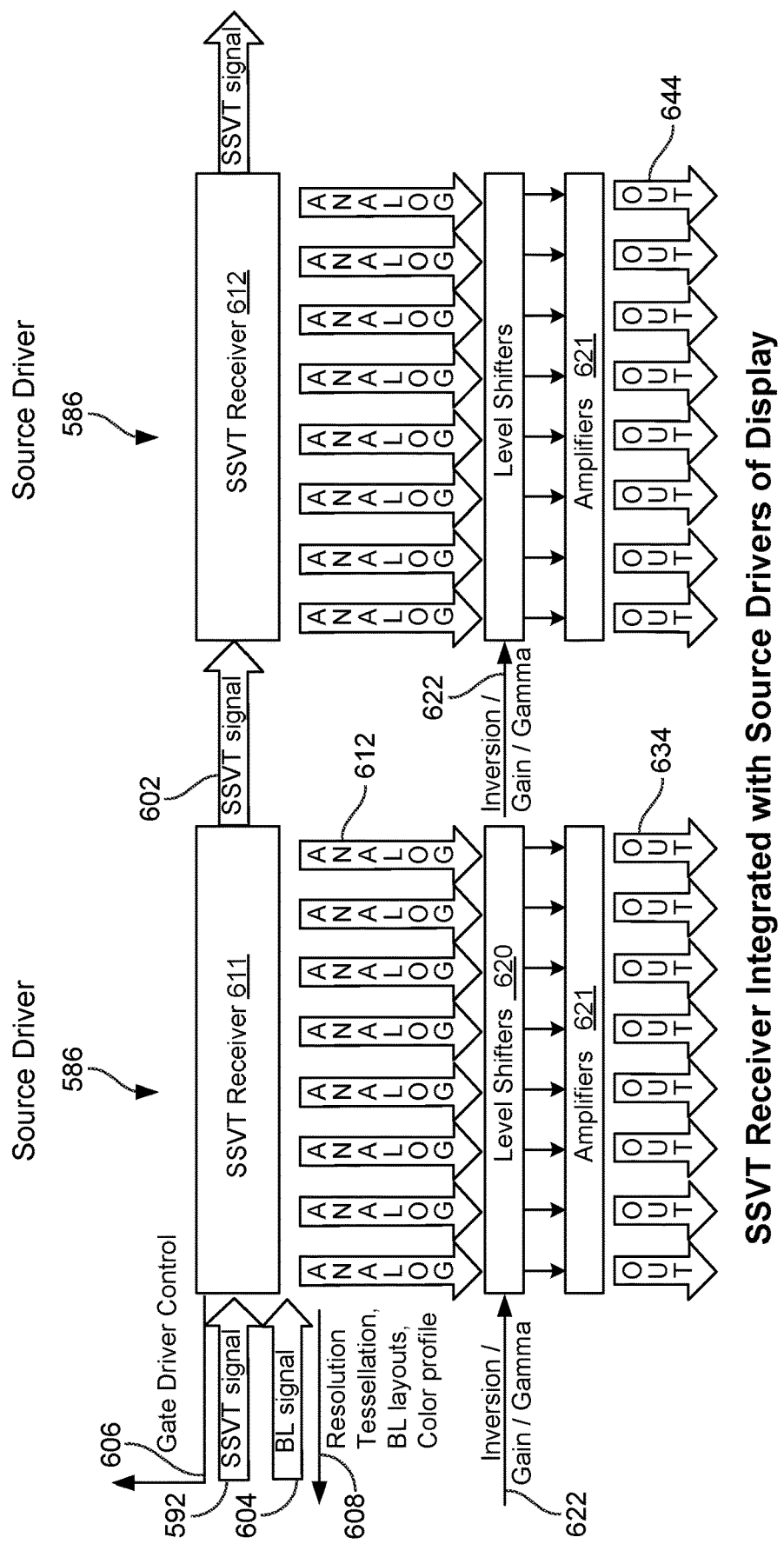
FIG. 2 illustrates examples of source drivers.
Figure 3:
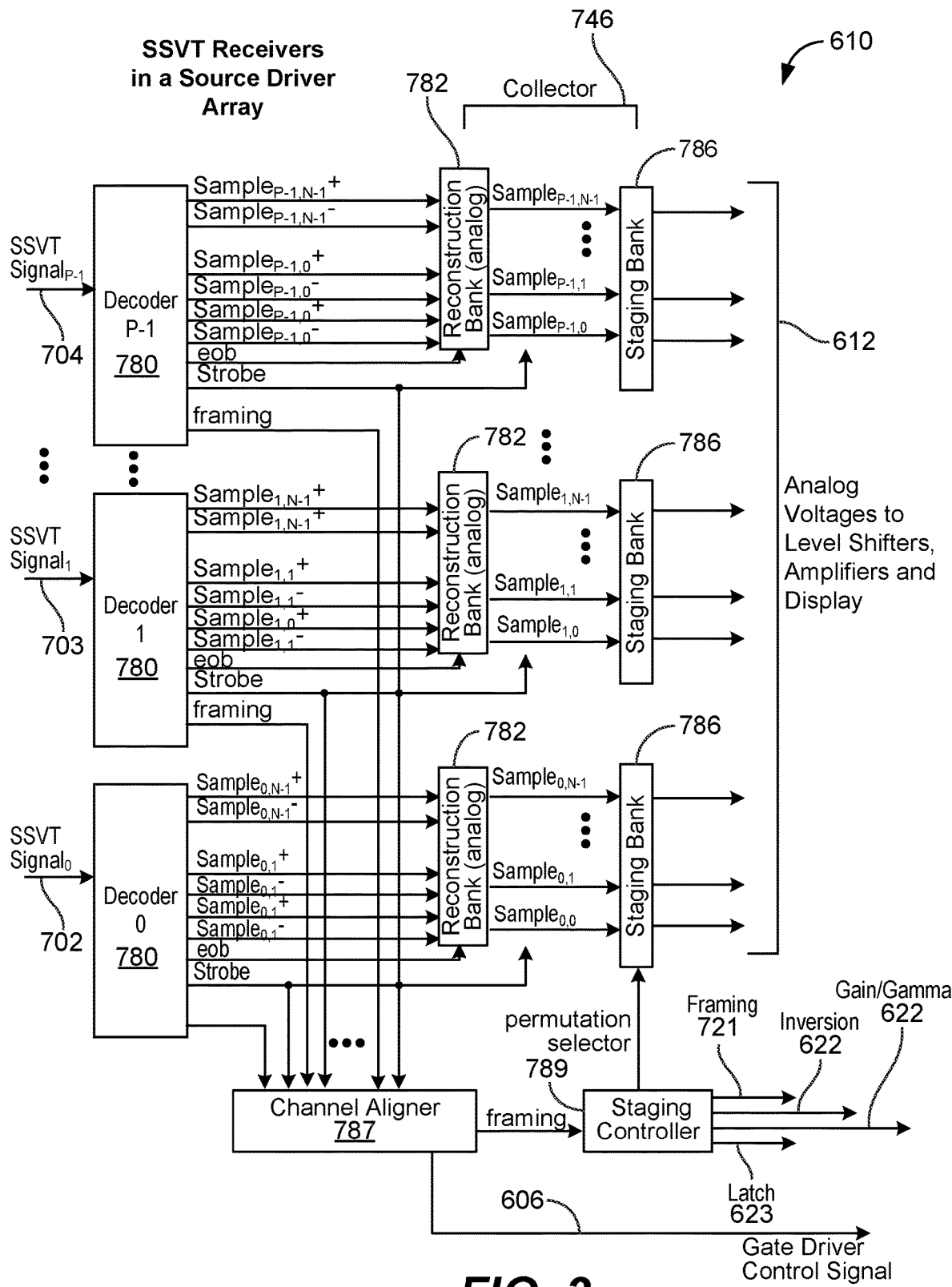
FIG. 3 illustrates a detailed view of a decoding unit of a source driver.

Generation of the gate driver control signals 590 for the gate drivers 560 may be performed by the timing controller (or by other specific hardware) and may be based on synchronization information from the source drivers. Many variations of providing the gate control signals are possible. The gate signal is a stand-alone signal in origin (start pulse +clock +control) but may be transported together with the SSVT signal as shown in FIGS. 2 and 3 (but need not be encoded). It may also be extracted from the embedded clock signal of the SSVT signal (decoder-->framing-->aligner). With modern "gate on array" panels, however, the gate signal needs to be modified to multiple clock pulses through a dedicated clock generation integrated circuit, making extraction from the SSVT clock signal less likely (but still possible using the appropriate aligner function). Thus, in an alternative embodiment, the gate signal 590 does not travel with the SSVT signals. Typically, the source driver input timing is coordinated with the gate driver timing by the TCON upstream. In one particular implementation, the wiring loom sends the gate driver control signals in parallel with the source driver signals, but the gate driver control signals do not enter the source drivers and are not generated by the source drivers. Nevertheless, signals 590 may propagate through the flexfoil connecting the source drivers, or may even be propagated through the source drivers themselves in another embodiment. Various of the embodiments below show gate signals traveling via the source drivers although such an arrangement is not required.

SSVT Encoder Example

Typically, an SSVT transmitter and an SSVT receiver (in this case, embedded in source drivers 586) are connected by a transmission medium. In various embodiments, the transmission medium can be a cable (such as HDMI, flat cable, fiber optic cable, metallic cable, non-metallic carbon-track flex cables), or can be wireless. There may be numerous EM pathways of the transmission medium, one pathway per encoder. The SSVT transmitter includes a distributor and multiple encoders. The SSVT receiver will include multiple decoders, the same number as the encoders. The number of pathways on the transmission medium may widely range from one to any number more than one. In this example, the medium will be a combination of cable, traces on PCBs, IC internal connections, and other mediums used by those of skill in the art.

During operation, a stream of time-ordered video samples containing color values and pixel-related information is received from a video source at the display unit 500 and delivered to the SSVT transmitter 540 via the SoC and TCON (processing by the SoC may be performed as is known in the art). The number and content of the input video samples received from the video source depends upon the color space in operation at the source (and, the samples may be in black and white). Regardless of which color space is used, each video sample is representative of a sensed or measured amount of light in the designated color space.

As a stream of input digital video samples is received within the SSVT transmitter, the input digital video samples are repeatedly (1) distributed by assigning the video samples into encoder input vectors according to a predetermined permutation (one vector per encoder) and (2) encoded by applying an SSDS-based modulation to each of the multiple encoder input vectors, using orthogonal codes, to generate multiple composite SSVT signals with noise-like properties (one analog signal from each encoder). The analog SSVT signals are then transmitted (3) over a transmission medium, one signal per pathway.

For purposes of explanation, one possible permutation implemented by a distributor for building four vectors $V_0$, $V_1$, $V_2$ and $V_3$ is one in which each of the vectors includes N samples of color information. In this example, the exposed color information for the sets of samples is "RGB" respectively. The exposed RGB samples of the sets of samples in this example are assigned to vectors $V_0$, $V_1$, $V_2$ and $V_3$ from left to right. In other words, the "R", "G" and "B" values of the left most sample and the "R" signal of the next set of samples are assigned to vector $V_0$, whereas the next (from left to right) "G", "B", "R" and "G" values of the next sample are assigned to vector $V_1$, the next (from left to right) "B", "R", G" and "B" values are assigned to vector $V_2$, and the next (from left to right) "R", "G", "R" and "R" values are assigned to vector $V_3$. Once the fourth vector $V_3$ has been assigned its signals, the above process is repeated until each of the four vectors $V_0$, $V_1$, $V_2$ and $V_3$ have N samples. In various embodiments, the number of N samples may widely vary.

By way of example, consider an embodiment with N=60. In this case, the total number of N samples included in the four vectors $V_0$, $V_1$, $V_2$ and V3 is 240 (60×4=240). The four encoder input vectors $V_0$, $V_1$, $V_2$ and $V_3$, when completely built up, include the samples (where S=3) for 80 distinct sets of samples (240/3=80). In other words:

Vector $V_0$ includes Samples $P_0$, $N_0$ through $P_0$, $N_{N-1}$;
Vector $V_1$ includes Samples $P_1$, $N_0$ through $P_1$, $N_{N-1}$;
Vector $V_2$ includes Samples $P_2$, $N_0$ through $P_2$, $N_{N-1}$; and
Vector $V_3$ includes Samples $P_3$, $N_0$ through $P_3$, $N_{N-1}$.

It should be understood that the above example is merely illustrative and should not be construed as limiting. The number of samples N may be more or less than 60. Also, it should be understood that the exposed color information for each set of samples can be any color information (e.g., Y, C, Cr, Cb, etc.) and is not limited to RGB. The number of EM pathways over the transmission medium can also widely vary. Accordingly, the number of vectors V and the number of encoders may also widely vary from one to any number larger than one. It should also be understood that any permutation scheme may be used to construct the input vectors.

Each vector of N samples is then encoded by its corresponding encoder and produces L output levels in parallel, using the encoding scheme described herein and shown in FIGS. 12-16. As described, the encoding may be analog (DACs placed before the encoders) or digital (in which the L levels are converted to analog by a DAC before being transmitted). The L analog output levels are then transmitted over its EM pathway as part of the SSVT signal to an SSVT receiver, which in this case are embedded in the source drivers 586.

Display Panel Source Driver

FIG. 2 illustrates display source drivers 586 out of an array of source drivers (others not shown). Multiple source drivers may be cascaded as shown; these multiple source drivers then drive the display panel. As shown, a source driver 586 does not require a DAC (in the signal path for converting digital samples into analog samples for display) as required in prior art source drivers. Input to an SSVT receiver of each source driver is an analog SSVT signal 592 that has been encoded upstream as is described above. In an alternative embodiment, each source driver will have its own SSVT signal.

Each SSVT receiver (e.g., 611, 612, etc.) includes a decoder, reconstruction bank and staging bank (such as decoder 0 which receives SSVT signal 702 of FIG. 3 and its corresponding reconstruction bank and portion of staging bank). Each SSVT receiver decodes the SSVT signal (described in greater detail below) and outputs numerous reconstructed analog voltage samples 612 in parallel from its collector 746 (the number of output samples corresponding to the number of outputs of the source driver). Because these analog outputs 612 may not be in the voltage range required by the display panel they may be input into level shifters 620 which shifts the voltages into a voltage range for driving the display panel using an analog transformation amplification may occur as well. Any suitable level shifters may be used as known in the art, such as latch type or inverter type. Level shifting typically occurs in the column drivers.

By way of example, the voltage range coming out of the SSVT receiver may be 0 to 1 V and the voltage range coming out of the level shifters may be −8 up to +8 V (using the inversion signal 622 to inform the level shifters to flip the voltage every other frame, i.e., the range will be −8 to 0 V for one frame and then 0 V to +8 V for the next frame). In this way, the SSVT signals do not need to have their voltages flipped every frame; the SSVT receiver provides a positive voltage range (for example) and the level shifters flip the voltage every other frame as expected by the display panel. The SSVT receiver may also implement line inversion and dot inversion. The inversion signal tells level shifters which voltages to switch. Some display panels such as OLED do not require this voltage flipping every other frame in which case the inversion signal is not needed and the level shifters would not flip voltages every other frame. Display panels such as LCD do require this voltage flipping. The inversion signal 622 is recovered from the SSVT receiver as will be explained below.

Also input into the level shifters 620 can be a gain and a gamma value; gain determines how much amplification is applied and the gamma curve relates the luminous flux to the perceived brightness which linearizes human's optical perception of the luminous flux. Typically, in prior art source drivers both gain and gamma are set values determined by the manufactured characteristics of a display panel. In the analog level shifters 620 gain and gamma may be implemented as follows. Gamma is implemented in the digital part of the system in one embodiment, and level shifting and gain are implemented in the source driver by setting the output stage amplification. In the case of gamma, implementation is also possible in the output driver, by implementing a non-linear amplification characteristic. (Another gamma correction is also performed in the timing controller or system-on-chip, but that gamma correction is not described here.)

Once shifted, the samples are input into amplifiers 621 which amplify each sample into the correct voltage range required by the particular display panel. Once amplified, the samples are output 634 and are used to drive the source electrodes in their corresponding column of the display panel as is known in the art.

In order to properly encode an SSVT signal for eventual display on a particular display panel various physical characteristics or properties of that display panel are needed by the GPU (or other display controller) or whichever entity performs the SSVT encoding. These physical characteristics are labeled as 608 and include, among others, resolution, tessellation, backlight layout, color profile, aspect ratio, and gamma curve. Resolution is a constant for a particular display panel; tessellation refers to the way of fracturing the plane of the panel into regions in a regular, predetermined way and is in units of pixels; backlight layout refers to the resolution and diffusing characteristic of the backlight panel; color profile is the precise luminance response of all primary colors, providing accurate colors for the image; and the aspect ratio of a display panel will have discrete, known values.

These physical characteristics of a particular display panel may be delivered to, hardwired into, or provided to a particular display controller in a variety of manners. In one example as shown in FIG. 1, signal 608 delivers values for these physical characteristics directly from the display panel (or from another location within a display unit) to the SSVT transmitter 540. Or, an SSVT transmitter embedded within a particular display unit comes with these values hardcoded within the transmitter. Or, a particular display controller is meant for use with only particular types of display panels and its characteristic values are hardcoded into that display controller.

Input to the display panel can also be a backlight signal 604 that instructs the LEDs of the backlight, i.e., when to be switched on and at which level. In other words, it is typically a low-resolution representation of an image meaning that the backlight LEDs light up where the display needs to be bright and they are dimmed where the display needs to be dim. The backlight signal is a monochrome signal that can also be embedded within the SSVT signal, i.e., it can be another parallel and independent video signal traveling along with the other parallel video signals, R, G and B (for example), and may be low or high resolution.

Output from SSVT receiver 611 is a gate driver control signal 606 that shares timing control information with gate drivers 560 on the left edge of the display panel in order to synchronize the gate drivers with the source drivers. Typically, each SSVT receiver includes a timing acquisition circuit that obtains the same timing control information for the gate drivers and one or more of the source driver flex foils (typically leftmost and/or rightmost source driver) will conduct that timing control information to the gate drivers. The timing control information for the gate drivers may be embedded within the SSVT signal and is recovered from that signal using established spread spectrum techniques.

Typically, a conventional source driver is connected directly to glass using "COF" (Chip-on-Flex or Chip-on-Foil) IC packages. It is possible to replace these drivers by the novel source drivers described herein, thus turning an existing display panel into an SSVT-enabled panel. The inputs of these ICs are usually connected together by a PCBA, providing the input signals from a video source and timing controller. These can be close to or far away from the display panel, transferring the video and control signals across an inexpensive wire.

As will be explained in greater detail below, portions of these source drivers may be integrated with the panel glass in various embodiments.

SSVT Decoding and Integration with Source Driver Detail

On the receive side, the decoder of each source driver is responsible for decoding the stream of the differential EM level signals received over the transmission medium back into a format suitable for display. Once in the suitable format, the video content contained in the samples can be presented on a video display, frame after frame. As a result, the video capture from any video source can be re-created by a video sink.

FIG. 3 illustrates a detailed logical view of SSVT receivers of a source driver array. This is a logical view in that typically each source driver will include a decoder 780 with its corresponding collector (reconstruction bank 782 and staging bank 786). P represents the number of input electromagnetic pairs, each pair carrying an SSVT signal independent from the others, except that they are isochronous signals, known to have been generated in lockstep with one another by encoders on the transmit side. A decoder 780 performs the inverse transform of its paired encoder on the transmit side and reconstructs its input differential level signals into an output vector of N reconstructed samples (although single-ended inputs rather than differential inputs may be used). The collector 746 assigns the decoder output vector samples (or, "reconstructed samples") to their predetermined positions in the analog samples 612. These samples 612 from each decoder correspond to the group of columns driven by each source driver.

The P decoders 780 (labeled 0 through P-1) are arranged to receive differential SSVT Signals$_0$ through SSVT Signals$_{P-1}$ respectively, 702-704. In response, each of the decoders 780 generates N differential pairs of reconstructed samples (Sample$_0$ through Sample$_{N-1}$). The number of samples, N, is equal to the number of orthogonal codes used for the earlier encoding i.e., there are N orthogonal codes used, meaning N codes from the code book.

Reconstruction banks 782 sample and hold each of the differential pairs of N reconstructed samples (Sample$_0$ through Sample$_{N-1}$) for each of the decoder output vectors at the end of each decoding interval respectively. These received differential pairs of voltage signals are then output as samples (Sample$_{N-1}$ through Sample$_0$) for each of the output vectors respectively. Each reconstruction bank may also convert from a differential pair to a single-ended voltage. As differential pairs are used to maintain accuracy in low voltages (they are more resistant to external influences than single-ended voltages), it can be preferable to convert into single-ended voltages as late as possible in the signal chain (by establishing a reference ground level). Thus, conversion to single-ended voltages need not occur in the reconstruction banks, but may occur later, such as in the column drivers, e.g., within the level shifters. Conversion is typically performed for all signals (samples, control signals, etc.) and may occur in different locations depending upon the signal type and implementation.

Each staging bank 786 receives all of the reconstructed samples (sample$_{n-1}$ through sample$_0$) from each of the decoder output vectors and serves as an analog output buffer as will be described in greater detail below. Once the samples are moved into a staging bank 786 they are triggered by a latch signal 632 derived from the decoded SSVT signal. The latch signal may be daisy-chained between source drivers. Once the samples are released from the staging bank they are sent to level shifters 620.

Also included is a channel aligner 787 and a staging controller 789, which receives framing information and aperture information from each decoder 780. In response, the staging controller 789 coordinates the timing of the staging banks 786 to ensure that all the samples come from a common time interval in which the level signals were sent by the SSVT transmitter. As a result, the individual channels of the transmission medium do not necessarily have to all be the same length since the channel aligner 787 and staging controller 789 compensate for any timing differences. The gate driver control signal 606 provides the timing information to the gate drivers (or to intermediate circuitry) which in turn provides the correct timing and control signals to the gate drivers, and may originate from channel aligner 787.

In one particular embodiment, P=24, thus, there are 24 decoders, each decoder within a source driver which is implemented in a separate integrated circuit. Also, in this embodiment, N=960, meaning each decoder decodes 960 video samples for display (not including any control signals).

Figure 4:
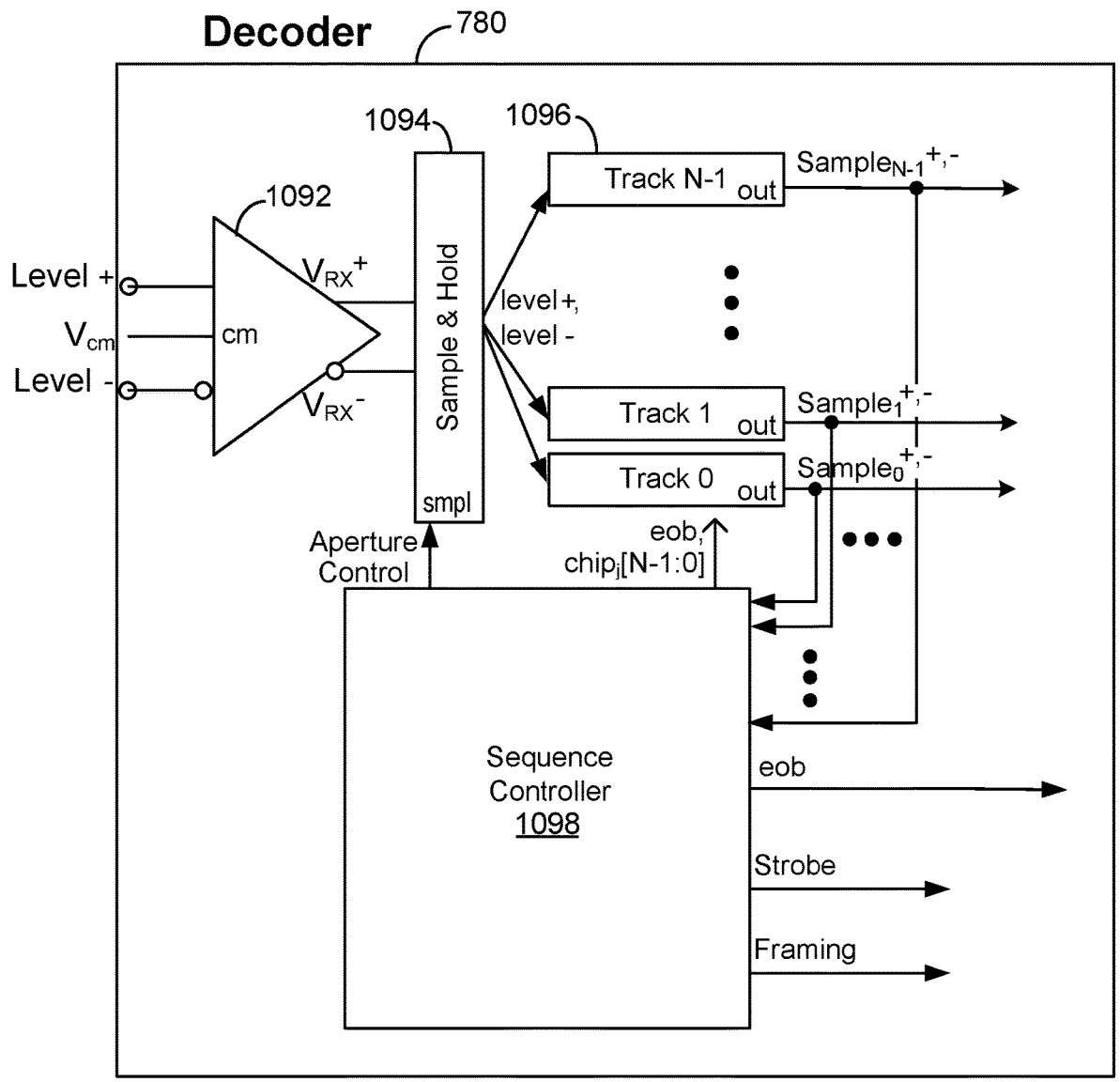
FIG. 4 is a logic diagram for one of the four decoders.

FIG. 4 is a logic diagram for one of the decoders 780. The decoder 780 includes differential amplifier 1092 and sample and hold circuit 1094 arranged to receive, sample and hold one of the differential EM level signals received over the transmission medium. The sampled EM level signals are then provided to each of N decoder track circuits 1096 (Track$_{n-1}$ through Track$_0$). A sequencer controller 1098 provides the same SSDS chip to each of N decoder track circuits 1096 that was applied on the transmit side respectively. As a result, the differential sample outputs (sample$_{n-1}$ through sample$_0$) are provided to the reconstruction bank 782. As a result, the demodulated samples sample$_{n-1}$ through sample$_0$ are the same as prior to modulation on the transmit side.

The sequence controller 1098 of each of the decoders 780 also generates a number of control signals, including a strobe signal, an end of bank (EOB) signal, an aperture signal and a framing signal. The EOB signal is provided to the reconstruction bank 782 and signifies the timing for when the staging bank 786 is completely full with samples. When this occurs, the EOB signal is asserted, clearing both the decoder tracks 1096 and the staging bank 786 in anticipation of a next set of reconstructed samples (N$_{n-1}$ through N$_0$). The aperture control signal is provided to the sample and hold circuit 1094, and the framing signal is provided to the channel aligner 787 and staging controller 789.

Figure 5:
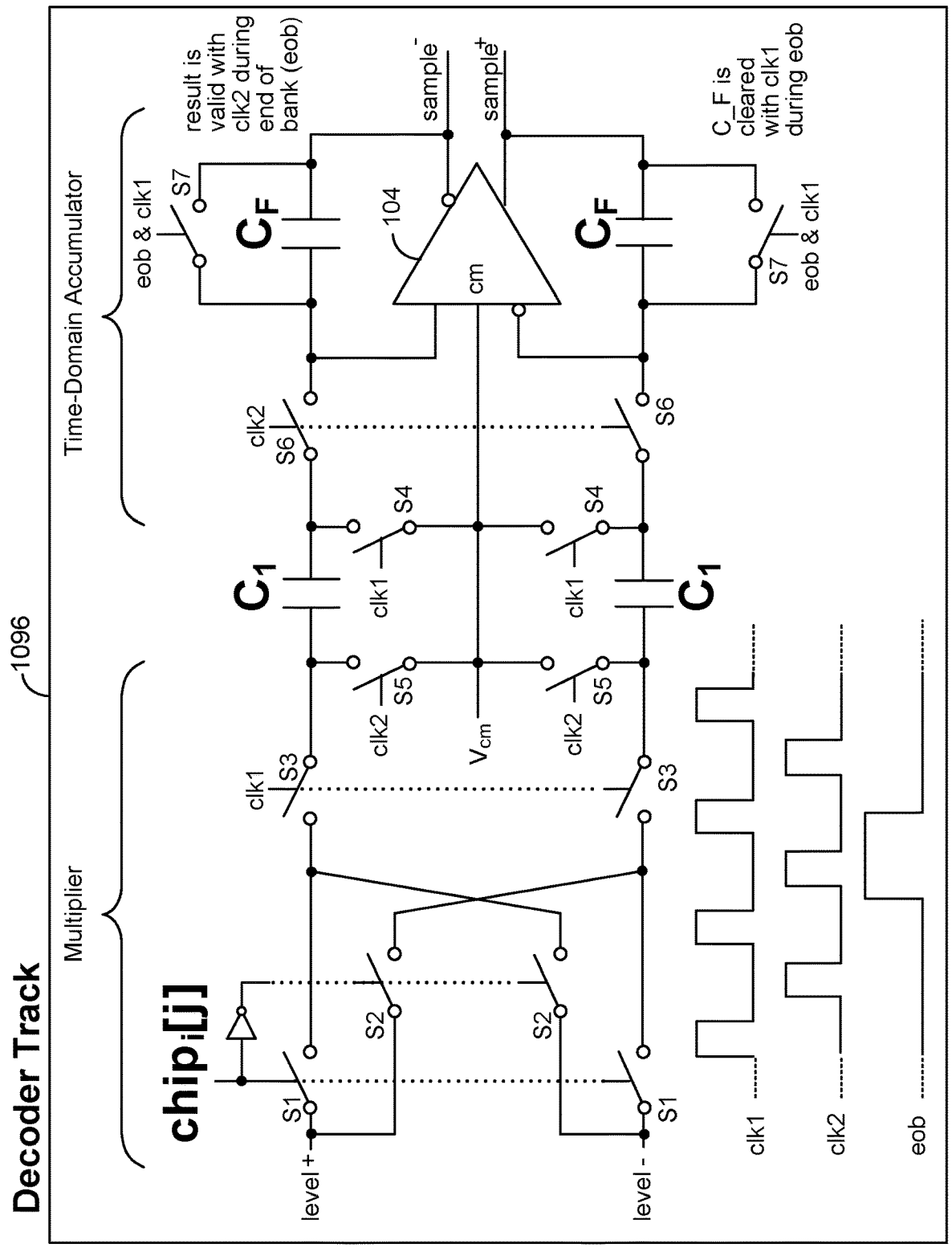
FIG. 5 is a diagram of a representative decoder track circuit is illustrated.

Referring to FIG. 5, a diagram of a representative decoder track circuit 1096 is illustrated. The decoder track circuit 1096 includes a multiplier portion and an accumulator portion. The multiplier portion includes a first pair of switches S1-S1, a second pair of switches S2-S2, a third pair of switches S3-S3 and a pair of capacitors C1-C1 on first (positive) and second (negative) power rails respectively. The accumulator portion includes additional pairs of transistors S4-S4, S5-S5, S6-S6 and S7-S7, an operational amplifier, and a pair of capacitors $C_F$ and $C_F$ on the first (positive) and second (negative) power rails respectively.

For each demodulation cycle, a differential EM level signal pair is received at the first level input (level+) terminal and a second level input (level−) terminal. The differential EM level signal pair is demodulated in the multiplier portion by conditionally inverting by multiplying by either (1) or negative (−1), depending on the value of the received chip from the corresponding code.

If the chip has a value of (+1), then transistor pairs S1-S1 and S3-S3 close, while S2-S2 remain open, when clk 1 is active. As a result, the voltage values at the first level input (level+) terminal and the second level input (level−) are passed onto and stored by the two capacitors C1 and C1 on the positive and negative rails respectively. In other words, the input values are multiplied by (+1) and no inversion takes place.

If the chip has a value of −1, then the S1-S1 switches are both off, while the switches S2-S2 and S3-S3 are all turned on when clk 1 is active. As a result, the voltage values received at the positive or first (+) terminal and the negative or second (−) terminal are swapped. In other words, the input voltage value provided at the first or positive terminal is directed to and stored on the capacitor C1 on the lower negative rail, while the voltage value provided on the second or (−) terminal is switched to and stored on the capacitor C1 on the positive upper rail. The received voltage values at the input terminals are thereby inverted or multiplied by (−1).

When clk 1 transitions to inactive, the accumulated charge on C1 and C1 remain. When clk 2 transitions to active, then transistor pairs S4-S4 open while transistor pairs S5-S5 and S6-S6 close. The accumulated charge on the capacitors C1 on the upper or positive rail and C1 on the lower or negative rail are then provided to the differential inputs of the operational amplifier. The output of the operational amplifier is the original +/− sample pair prior to encoding on the transmit side The accumulated charge on the two capacitors C1 and C1 are also passed on to the capacitors CF and CF on the upper or positive rail and the lower or negative rail when Clk 2 is active. With each demodulation cycle, the charges on the capacitors C1 and C1 on the upper and lower rails are accumulated onto the two capacitors CF and CF on the upper and lower rails, respectively. When clk 1 and the EOB signal are both active, then the transistor pair S7-S7 are both closed, shorting the plates of each of the capacitors CF and CF. As a result, the accumulated charge is removed, and the two capacitors CF and CF are reset and ready for the next demodulation cycle.

Since each decoder 780 has N decoder track circuits 1096, N decoded or original +/− sample pairs are re-created each demodulation cycle. These N +/− sample pairs are then provided to the reconstruction bank 782 and then to the staging bank 786.

The decoder track 1096 reconstructs incoming level samples over a succession of L cycles, demodulating each successive input level with the successive chips of that tracks code. The results of each of the L demodulations is accumulated on the feedback capacitor CF. When EOB is asserted during clk1 corresponds to the first demodulation cycle of the decoding cycle, CF is cleared after EOB such that it can begin again accumulating from zero volts or some other reset voltage. In various embodiments, the value of L is a predetermined parameter. In general, the higher the parameter L the greater the process gains and the better the electrical resiliency of the transmission of the SSVT signals over the transmission medium. On the other hand, the higher the parameter L, the higher the required frequency for the application of the SSVT modulation, which may compromise the signal quality due to insertion losses caused by the transmission medium. The above-described demodulation cycle is repeated over and over with each of the decoders 780.

Integration of Source Drivers with Display Panel Glass

A display panel (such as an LCD panel) is made from a glass substrate with thin-film transistors (TFTs) formed upon that glass substrate, i.e., field-effect transistors made by thin-film deposition techniques. These TFTs are used to implement the pixels of the display. It is now realized that those TFTs (along with appropriate capacitors and resistors, and other suitable analog components) can also be used to create logic circuitry to implement elements of the novel source drivers described herein which are then integrated with the glass. These elements are integrated at the extreme edges of the glass, just outside the pixel display area, but inside the perimeter seal of the glass. Thus, the source drivers disclosed herein may be integrated with the glass using these transistors, capacitors, resistors, etc. And may do so in embodiments as described below. Accordingly, the source drivers (or elements thereof) which had previously been located outside of and at the edge of the display panel glass are now moved onto the display panel glass itself. In addition, the gate driver functionality for the gate drivers may also be moved onto the display panel glass.

Figure 6:
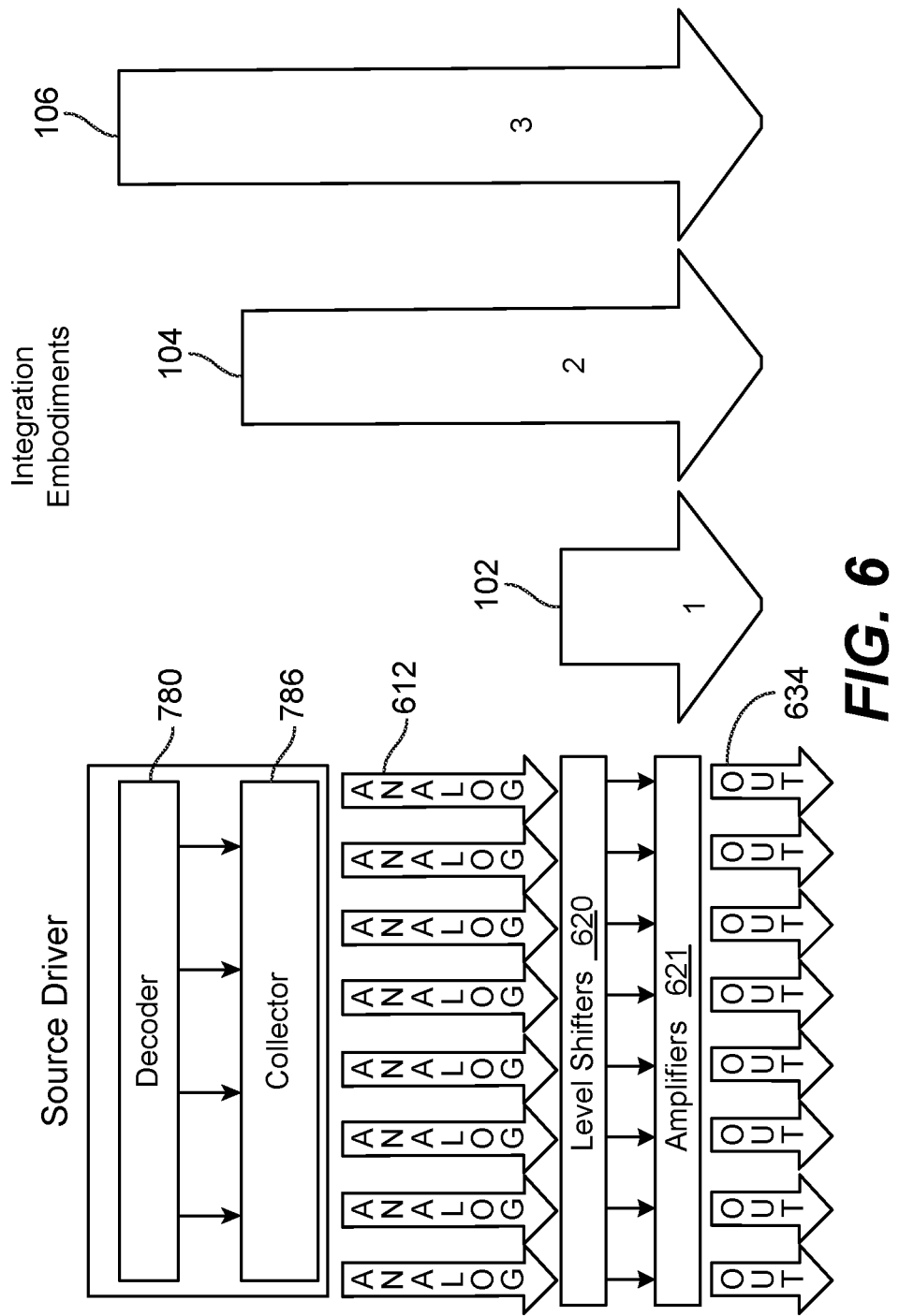
FIG. 6 illustrates implementation of the integration of source driver functionality in various embodiments.

FIG. 6 illustrates implementation of the integration of source driver functionality in various embodiments. Depending upon the transistor quality used on the glass, various elements of a source driver may be integrated with the glass. As known in the field, TFTs (for example) range from handling lower frequencies up to higher frequencies. There are three main technologies used for TFT manufacturing: amorphous silicon (a-Si); oxide (indium-gallium-zinc oxide ("IGZO" or similar materials), which can handle frequencies from about 50 kHz to 100 kHz, routinely and up to about 200 kHz depending upon the voltage used (oxide is capable of frequencies of up to 1 MHz at 50 volts for certain components); and low temperature poly-silicon (LIPS) which can handle frequencies having an order of magnitude of about 5 MHz, up to about in excess of 10 MHz depending upon the voltage used. In addition, crystalline silicon TFTs implemented using CMOS technology may be able to handle even greater frequencies. Other types of TFTs may also be used.

If faster TFT transistors of higher quality are used then higher frequency portions of the source driver may be integrated with the glass. Also, smaller device sizes will allow for the transistors to switch faster, thus enabling implementation on glass of elements using those devices. For example, the channel length of a TFT affects its size; preferably the channel length for oxide TFTs is less than about 0.2 um and the preferable channel length for LTPS TFTs is less than about 0.5 um. Reducing the channel length by 50% yields an increase in speed by a factor of four. Further, implementation may depend upon the type of display; display sizes of smaller resolution 2K, 1K and smaller may use elements that do not require the high frequency of 4K and 8K displays. Typically, amorphous silicon transistors would not be used as they have a tendency to threshold shift and are not stable.

For example, in a first embodiment 102, level shifters 620 and amplifiers 621 are integrated with the glass because the level shifters only require a relatively low-frequency clock. As the level shifters switch once per line they require a switching frequency of about 50 kHz for a 2K display, 100 kHz for a 4K display, etc. Thus, the first embodiment of integration may use TFTs that can operate at a clock frequency of at least about 50 kHz, assuming a 2K panel (100 kHz for a 4K panel, etc.). Thus, IGZO or LTPS TFTs may be used in the first embodiment.

In a second embodiment 104 using faster transistors, level shifters 620, amplifiers 621 and collector 786 may also be integrated with the glass. Collector 786 requires a higher-frequency clock as each collector is manipulating the pixel sequence and requires a switching frequency of about 50 MHz for a 2K display, 100 MHz for a 4K display, etc. Thus, the second embodiment of integration may use TFTs that can operate at a clock frequency of at least about 50 MHz, assuming a 2K panel. Thus, LTPS TFTs may be used in the second embodiment for 2K panels.

In a third embodiment 106 using yet faster transistors the entire source driver may be integrated with the glass including the decoder 780, collector, amplifiers and level shifters as the decoder may require yet a higher-frequency clock, at least about 300 MHz. Thus, the third embodiment may use TFTs that can operate at a clock frequency of at least about 300 MHz, assuming a 2K panel and assuming that TFTs are implemented on the glass with about a 100 nm resolution. Depending upon the implementation and specific type of TFTs used, a lower clock frequency may be used.

Note that the source driver disclosed herein does not require use any digital-to-analog converters to convert video samples and thus the higher-frequency clock required by the decoding is still approximately ten times lower frequency than the digital driving signals required in prior art source drivers (digital driving is at about 3 GHz).

Figure 7A:
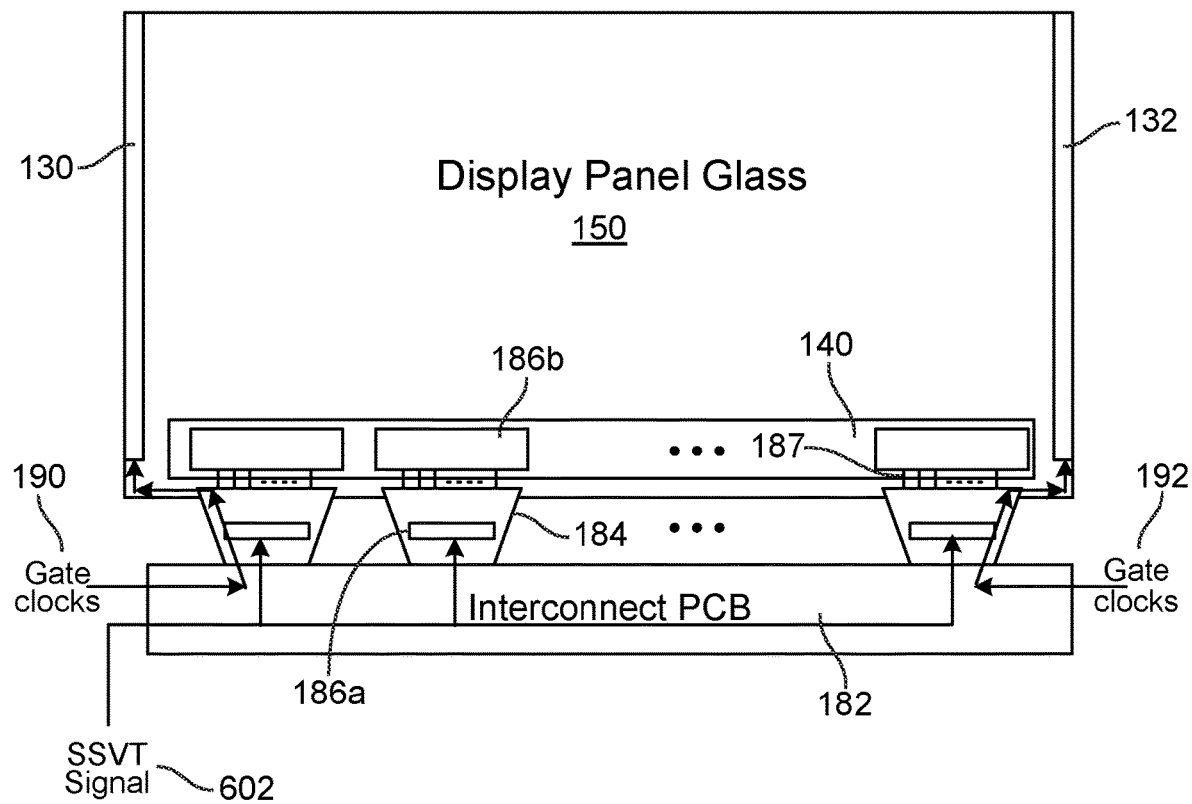
FIG. 7A illustrates placement of elements of the source drivers on the display panel glass.

FIG. 7A illustrates placement of the gate drivers and source drivers on the display panel glass. Typically, a display panel will be implemented with two glass substrates, a top (or common) glass and a bottom (or active) glass, the bottom glass being smaller than the top glass. The TFTs are implemented on the bottom glass and the below description refers to this bottom glass and the drawings show only the bottom glass. Shown is display panel glass 150 by itself (not shown is the panel frame or the enclosing display unit for clarity) having two rectangular areas 130 and 132 on both sides of the display panel glass (in this example, an LCD panel) having a width of several millimeters wide. In this embodiment, the gate drivers are also integrated using TFT devices on the glass as switching elements. Since gate drivers are typically implemented as a simple shift registers, these shift registers may be located in areas 130 or 132.

Shown also is rectangular area 140 also located upon the glass itself in which elements of the source drivers may be located. The source driver functionality may be partially or fully integrated with the glass by making use of TFT switches on the glass in this area 140. In the first embodiment is the integration of the amplifiers (and level shifters) onto the glass (which are formed in region 140), while in the second embodiment is the integration of the amplifiers (and level shifters) and collector (which are also formed in region 140).

As the source drivers disclosed herein have no need for digital signals, D-to-A converters and related circuitry for processing the video samples, the lower processing frequencies and smaller dimensions of these drivers allow for them to be integrated onto the glass. Thus, for example, since a typical 64-inch 4K television panel has a pixel width of 80 um (40 um in case of an 8K display), there is also sufficient width to integrate the drivers directly onto the glass because the dimensions of the output amplifiers are expected to fit within this space. Depending upon the pixel width of a particular implementation, specific TFTs may be chosen.

An interconnect printed circuit board 182 receives and passes the SSVT signal 602 via flexible PCBs 184 to the source drivers located on integrated circuits 186a and partially integrated with the glass in TFTs 186b. Passing the SSVT signal in this fashion is implemented for embodiments 1 and 2 as a portion of each source driver (at least the decoder) will still be located within flexible PCBs 184 on the IC 186a. As shown, each integrated circuit 186a passes analog signals 187 to its corresponding circuitry on glass 186b. The nature of these analog signals will depend upon whether embodiment 1 or embodiment 2 is being implemented. An implementation for embodiment 3 is shown below. Gate clocks 190 and 192 are delivered to the gate drivers via circuit board 182 and flexible PCBs 184. PCBs 184 attach to panel glass 150 as is known in the art.

Figure 7B:
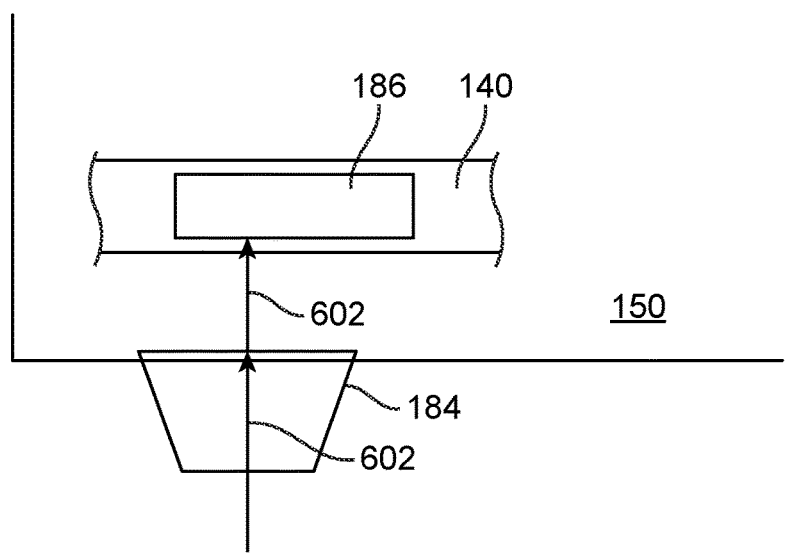
FIG. 7B illustrates placement of an entire source driver on the display panel glass.

FIG. 7B shows a source driver 186 completely implemented on the glass. In this third embodiment is a full integration of the source driver functionality upon the glass which also includes the decoder. As shown, flexible PCB 184 includes only SSVT signal 602 and no source driver functionality such as decoder, collector, level shifters and amplifiers; all source driver functionality is implemented in TFTs (and other analog components) on the glass. Although not shown, each other source driver may have its own PCB 184 and SSVT signal 602 (from a corresponding SSVT transmitter); in one particular embodiment, there are 24 such source drivers.

Figure 8:
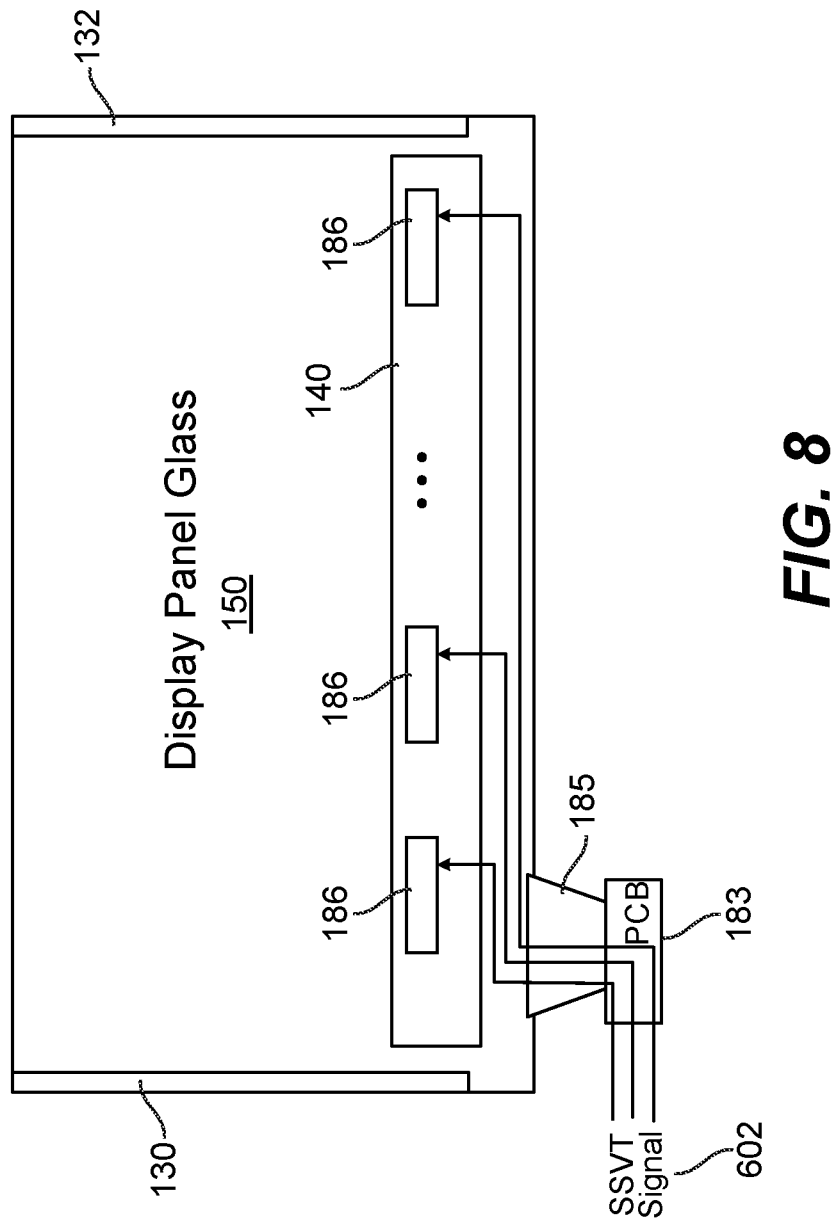
FIG. 8 illustrates placement of the SSVT signal when embodiment 3 is implemented.

FIG. 8 illustrates another embodiment of placement of the SSVT signal 602 when embodiment 3 is implemented. As mentioned earlier, in embodiment 3 all functionality of the source drivers (including the decoders) are integrated with the glass, thus there is no need to deliver the SSVT signals 602 via a large circuit board 182 (the length of the display) and then via numerous flexible PCBs 184 as shown in FIGS. 7A and 7B. Accordingly, a much smaller printed circuit board 183 and a single flexible PCB 185 are attached to one location of the display panel glass 150 and the SSVT signals 602 are passed via 183 and 185 to the glass and then transported along the glass where it is delivered to each of the source drivers on the glass within region 140. Further, no integrated circuit 186 is needed on the flexible PCB as all of the functionality of each source driver is now on the glass. As shown, SSVT signals 602 are delivered in parallel to each of the source drivers whereas FIGS. 2 and 6 shows an implementation where the SSVT signal 602 is delivered by daisy chaining to each source driver.

Integration with Display Panel Glass Alternative Embodiment

Figure 9:
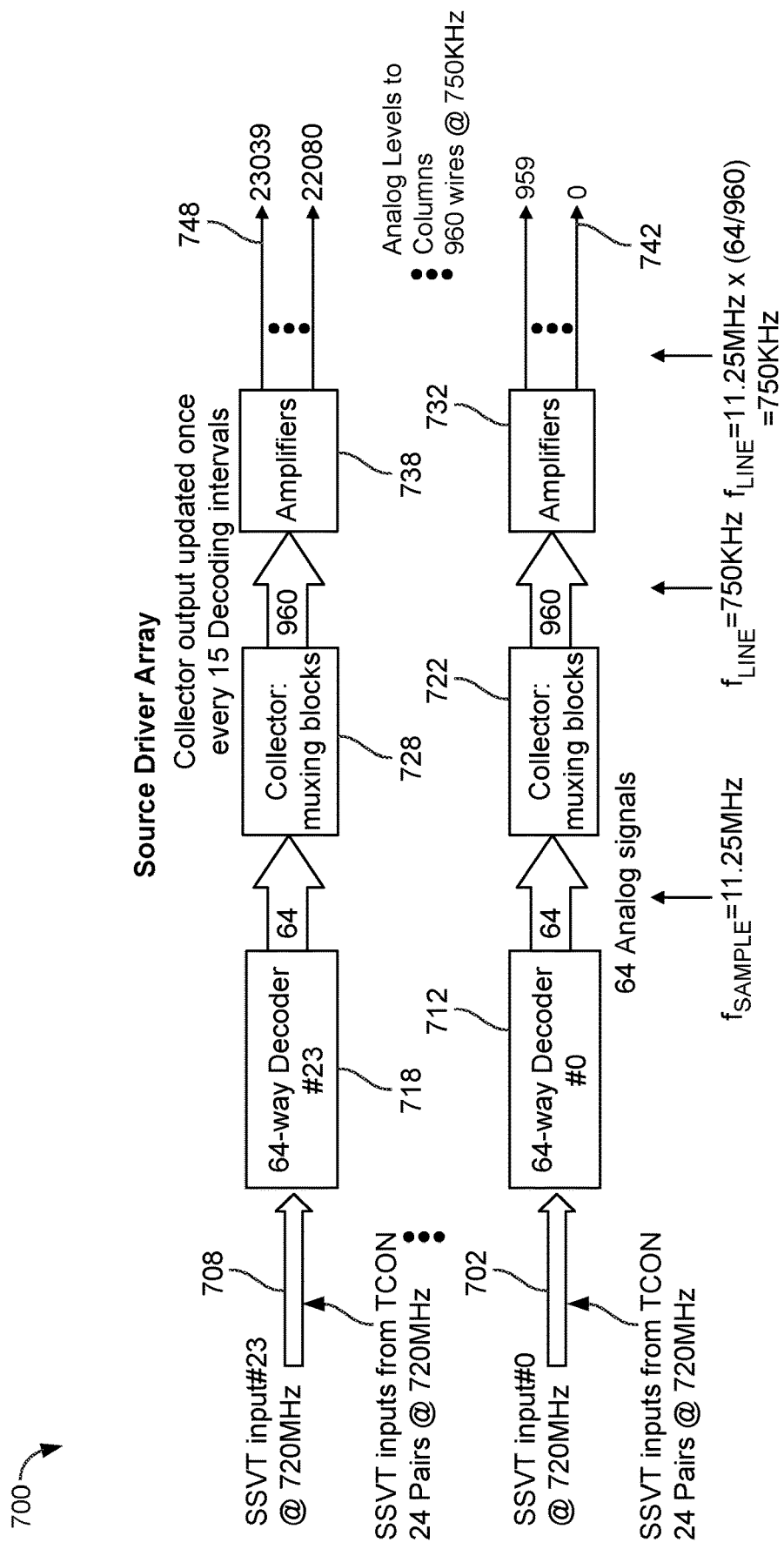
FIG. 9 illustrates a source driver array that may be integrated with the display glass of a display unit.

FIG. 9 illustrates a source driver array 700 that may be integrated with the display glass of a display unit. As shown, 24 wire pairs 702-708 each carrying an SSVT signal from an integrated timing controller with SSVT transmitter or an SSVT transmitter itself arrive at decoders 712-718 at an input frequency of 720 MHz. The decoders decode these input signals, each producing 64 analog samples (or signals) which are input into collectors 722-728 at a frequency of 11.25 MHz. Each collector then collects a set of 64 samples each decoding interval and every 15 decoding intervals outputs 960 signals at a frequency of 750 kHz (64×15=960). Each set of 960 signals is then input into amplifiers 732-738, amplified, and these signals are then output over 960 wires as analog levels at 750 kHz to the columns of the display panel, thus producing pixels of an image originally encoded upstream by an SSVT transmitter. The quantity of wire pairs, decoders, collectors, amplifiers and signals is particular to this example and other source driver arrays and display panels may have different values. Not shown in this drawing are the level shifters which may be included within the amplifier blocks.

In this example, the frequencies used for an 8K display unit (including 24) source drivers) are: 720 MHz, for the decoders, 11.25 MHz for the collectors, and 750 kHz for the amplifiers. The frequencies used for a 4K display unit (including 12 source drivers) are: 360 MHz for the decoders, 5.62 MHz for the collectors, and 375 kHz for the amplifiers; and the frequencies used for an HD display unit (including 6 source drivers) are: 180 MHz for the decoders, 2.8 MHz for the collectors, and 185 kEz for the amplifiers.

In this example the embodiments of integration may be as follows. In embodiment 1 we integrate only the amplifiers 732-738 on glass (including level shifters), leaving the low-voltage analog driver ICs external to the glass. Thus, there will be the same. number of external connections as a "non-integrated" driver. The specification for frequency of TFTs to be used on glass is roughly 200-750 kHz (depending upon the size of the display unit). In embodiment 2 we also integrate the collectors 722-728 along with the amplifiers (and level shifters), the collectors handling a low MHz input signal, e.g., about 11 MHz for an 8K display unit. There will be reduced external connections (only 64 per driver, instead of 960). It is also possible to integrate several of the external ICs 186a (holding the decoders) into a larger, single IC (e.g., combine every six ICs), leading to fewer external connections (e.g., combining the decoders of six drivers leads to 384 outputs which is no problem for interconnection as normal drivers have 960 outputs), and results in only four external ICs instead of 24. In embodiment 3 we integrate all components of the source drivers on glass: decoders 712-718, collectors and amplifiers (and level shifters). The specification for frequency of TFTs to be used is roughly 720 MHz for an 8K unit, 360 MHz for a 4K unit, and 180 MHz for an HD unit. There will be only a few external connections such as the 48 SSW lines 702-708, plus a power supply connection.

Figure 10:
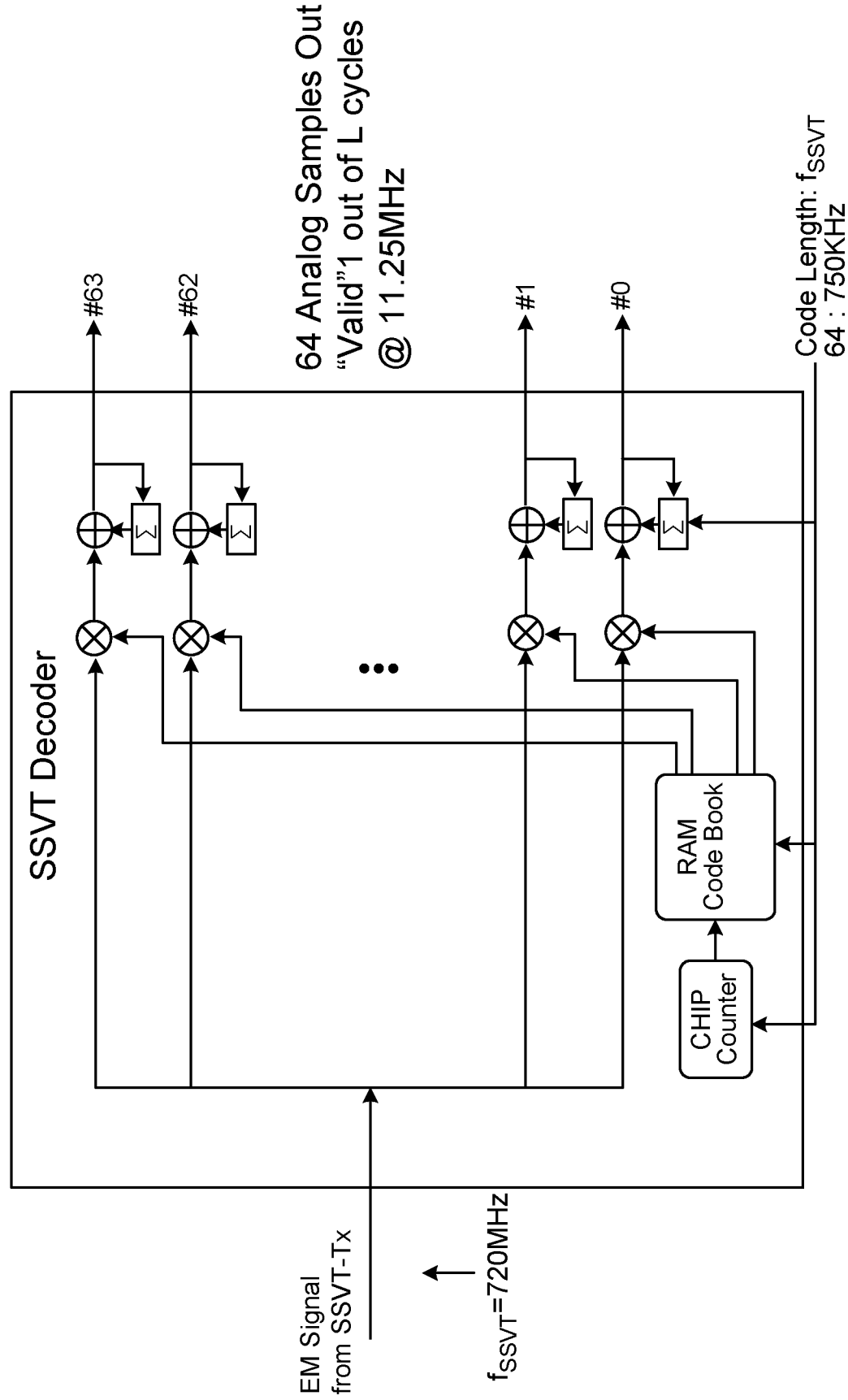
FIG. 10 illustrates one of the decoders from FIG. 9.

FIG. 10 illustrates one of the decoders from FIG. 9.

Figure 11:
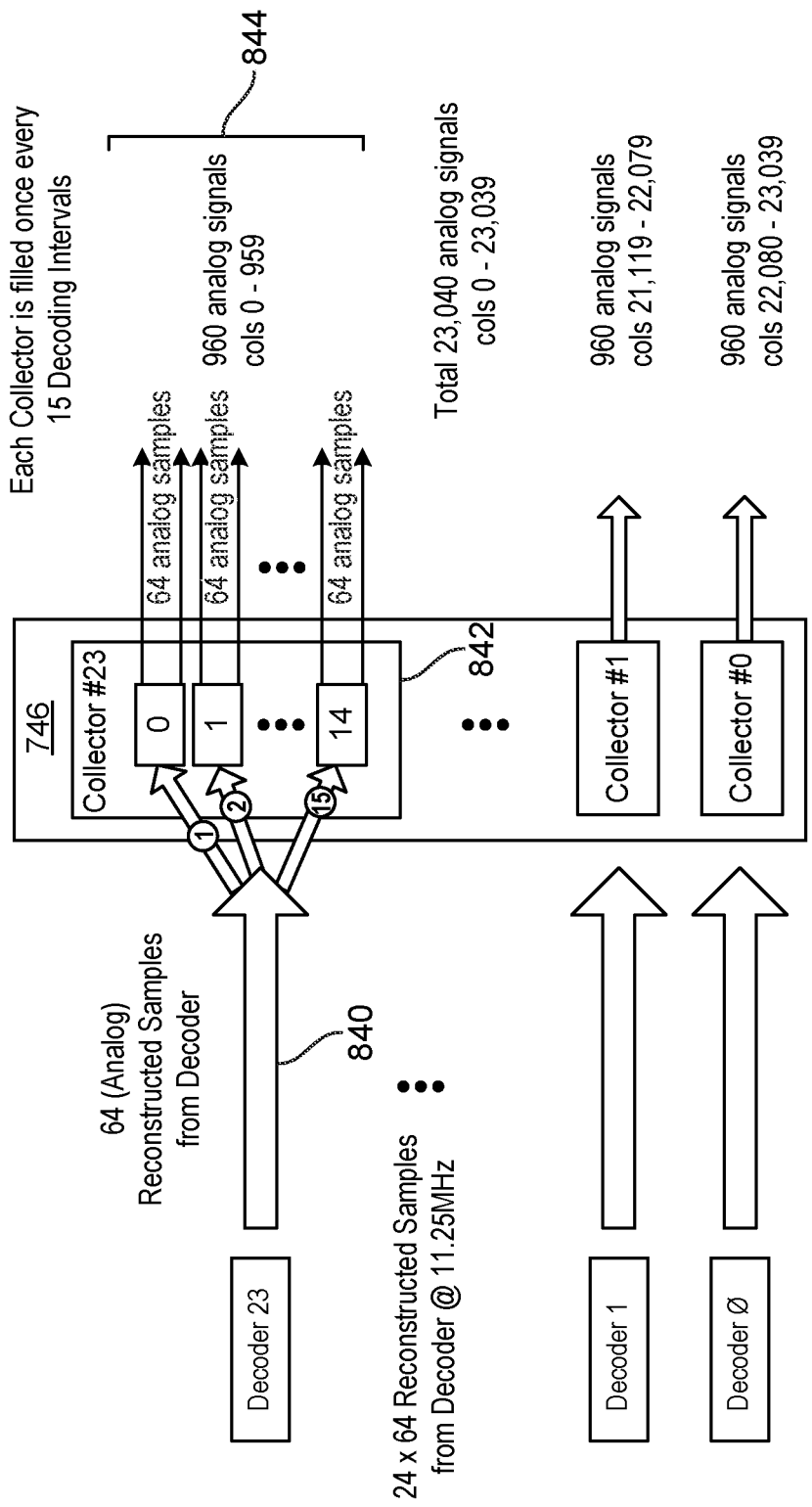
FIG. 11 illustrates the collectors from FIG. 9.

FIG. 11 illustrates the collectors from FIG. 9. As shown, 64 analog samples 840 from each decoder are input into each collector 842 in each decoding interval. Each group of 960 signals per collector 842 are then output as analog signals 844 once collector 746 is full. Collector 746 thus functions as a line buffer.

Collector and Amplifier Specific Embodiment

Figure 18:
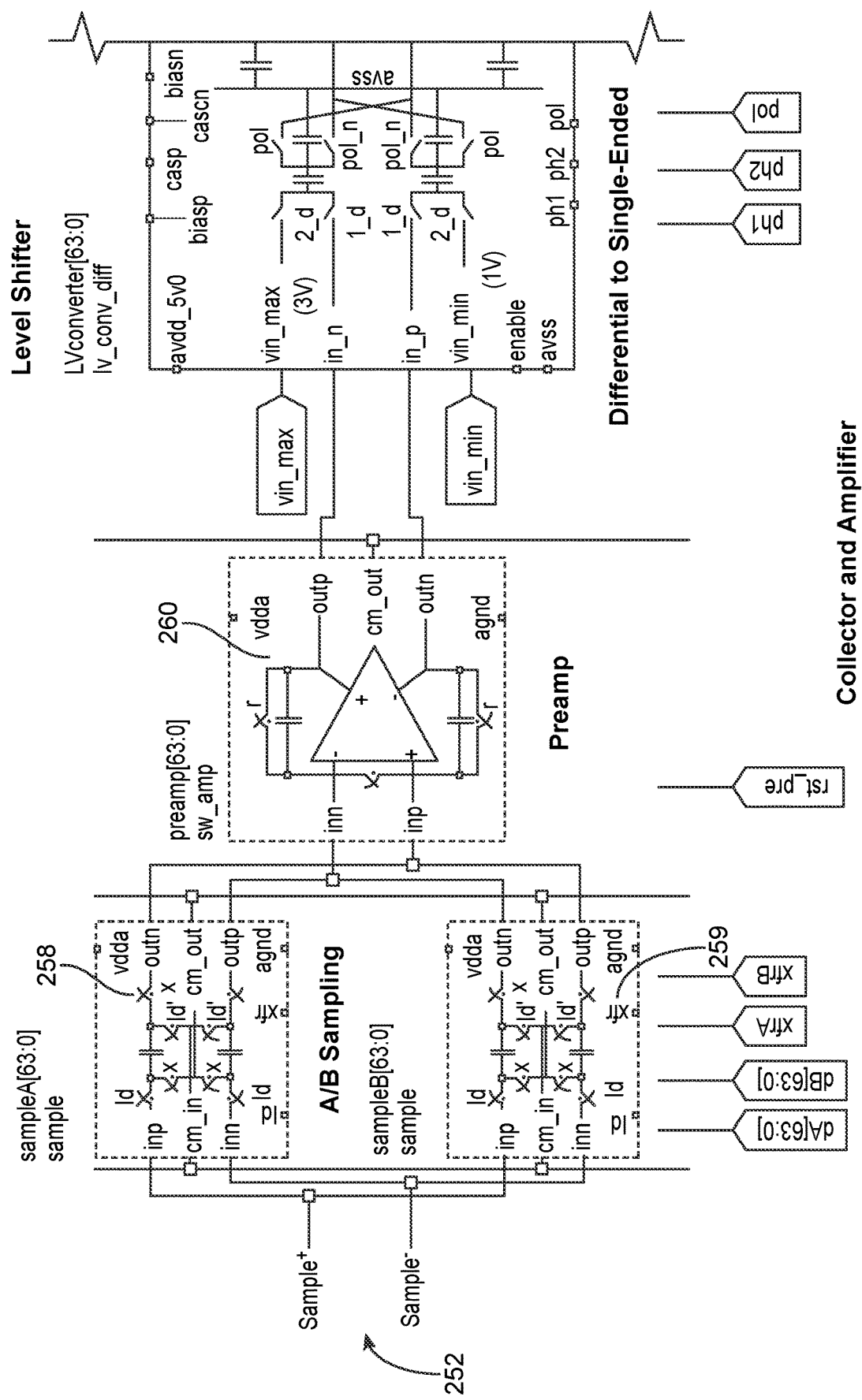
FIG. 18 illustrates one specific embodiment of o a collector and amplifier may be implemented for one of the decoders.
Figure 18:
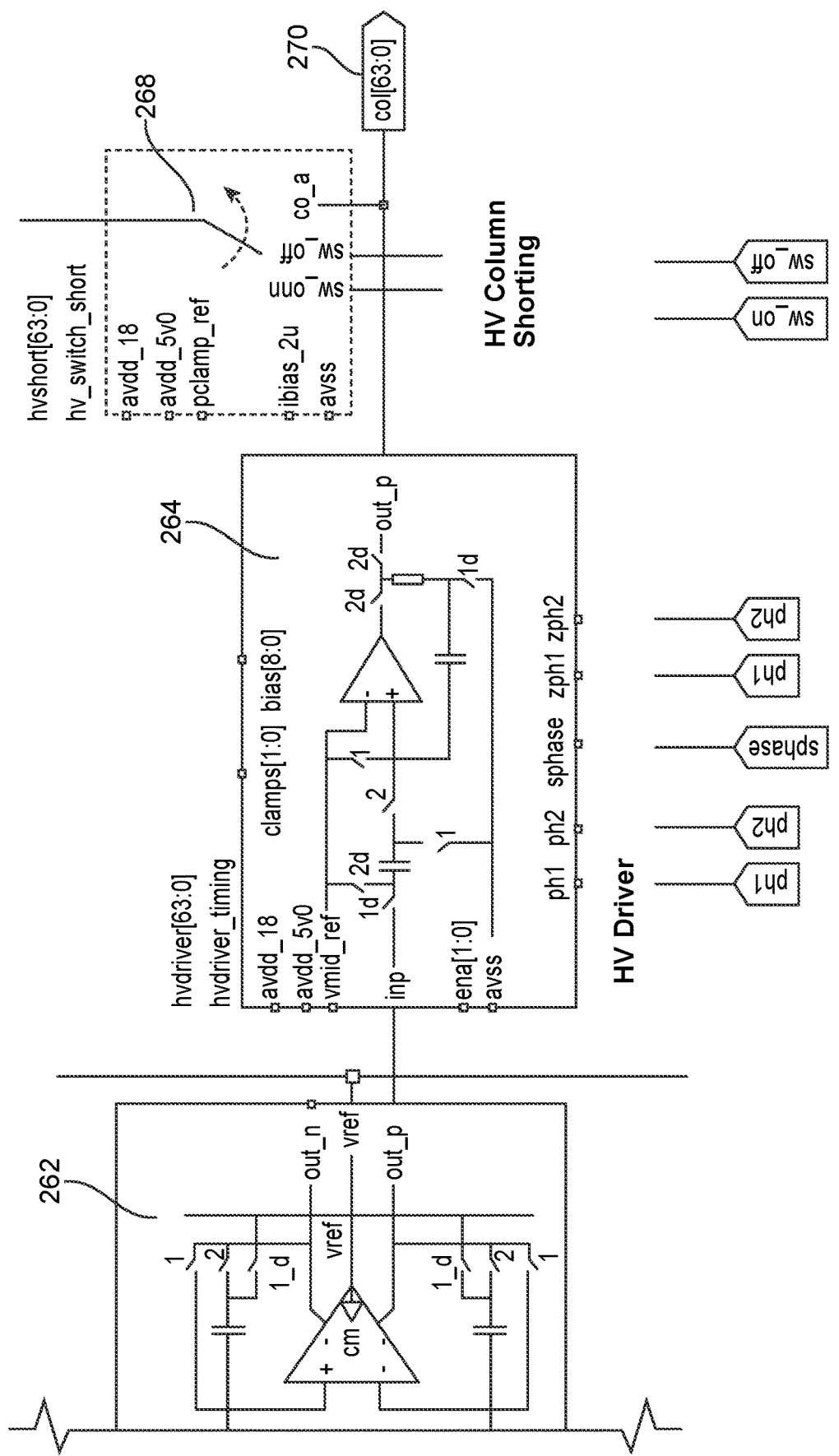

FIG. 18 illustrates one specific embodiment of how a collector and amplifier may be implemented for one of the decoders. In this particular example the source driver drives an LCD display and various of the components shown are particular to that type of display. The invention, however, is applicable to other types of displays as well. Shown is a portion of a collector that stores 64 samples [63:0] and amplifies 64 samples; the collector portion and amplifier portion shown are replicated in order to output 960 analog samples as shown in FIG. 11.

Shown is an input of one sample differential pair 252 into a storage cell of A/B Sampling 258 and 259 (the collector); each storage array A or B holds 960 storage cells (only 64 are indicated in the figure) and the incoming samples from the decoder are all stored into array A or B (64 at a time using the embodiment of FIG. 11). Once all 960 samples are stored into array A or B they may then be output in parallel as shown in FIG. 11 to the amplifiers. In one embodiment, each of these storage cells in storage array A or B is a switched capacitor or sampling capacitor; the array may also be referred to as an analog latch.

Once stored (in array A, for example) these 960 samples are output in parallel while at the same time the next set of 960 analog samples are being stored into the other array (B, for example). Thus, while one set of 960 samples stored in the collector are being driven to the amplifiers from one of the A or B arrays, the next set of 960 samples are being stored in the other array of the collector. This embodiment of the collector is thus a two-stage latch—one stage outputs while the other stage is filled. This embodiment is used when input into one bank is serial or not completely in parallel and thus avoids delay. In another embodiment, the first stage simply outputs in parallel into the second stage when full and then resumes filling.

In an alternative embodiment there is only a single stage in the collector, e.g., only storage array A, and once that array is filled it then outputs its contents in parallel and then resumes filling with new samples. This embodiment may be used when the stage may be filled fast enough so that there is no significant delay in the output of the samples in parallel. FIG. 11 shows such a single-stage collector.

Also shown is one of the 64 pre-amplifiers 260 of this figure, each associated with one of the storage cells of array A or B. Once the array outputs its samples, all 960 pre-amplifiers of the source driver will be amplifying samples at the same time. Depending upon the implementation, the pre-amplifiers may be optional.

Shown also is one of 64 level shifters 262 of this figure that converts the differential signal into a single-ended signal, adds an offset, changes the polarity of the signal, and provides amplification. Depending upon the implementation, the level shifter (or portions of it) may be optional, e.g., conversion to a single-ended signal may happen elsewhere. Each pre-amplifier outputs into one of the level shifters.

High-voltage driver 264 (aka column driver) is one of 64 such drivers of this figure that multiplies the incoming signal to provide the voltage (plus or minus) expected by the display. Column shorting 268 provides shorting for LCD displays as is known in the art. Finally, the expected voltage is output to the column at 270 for a total of 960 outputs (only 64 are indicated in the figure). The level shifter 262, high-voltage driver 264 and shorting 268 components may also be referred to as the "column driver." The preamplifier 260, level shifter 262 and high-voltage driver 264 may be considered an amplification stage before each column, and in this case is a pipeline amplifier or simply an amplifier. Essentially, components 260, 262 and 264 all provide amplification as well as other functions depending upon the type of display. Other types of displays may have different configurations.

Mobile Telephone Specific Embodiment

Figure 17:
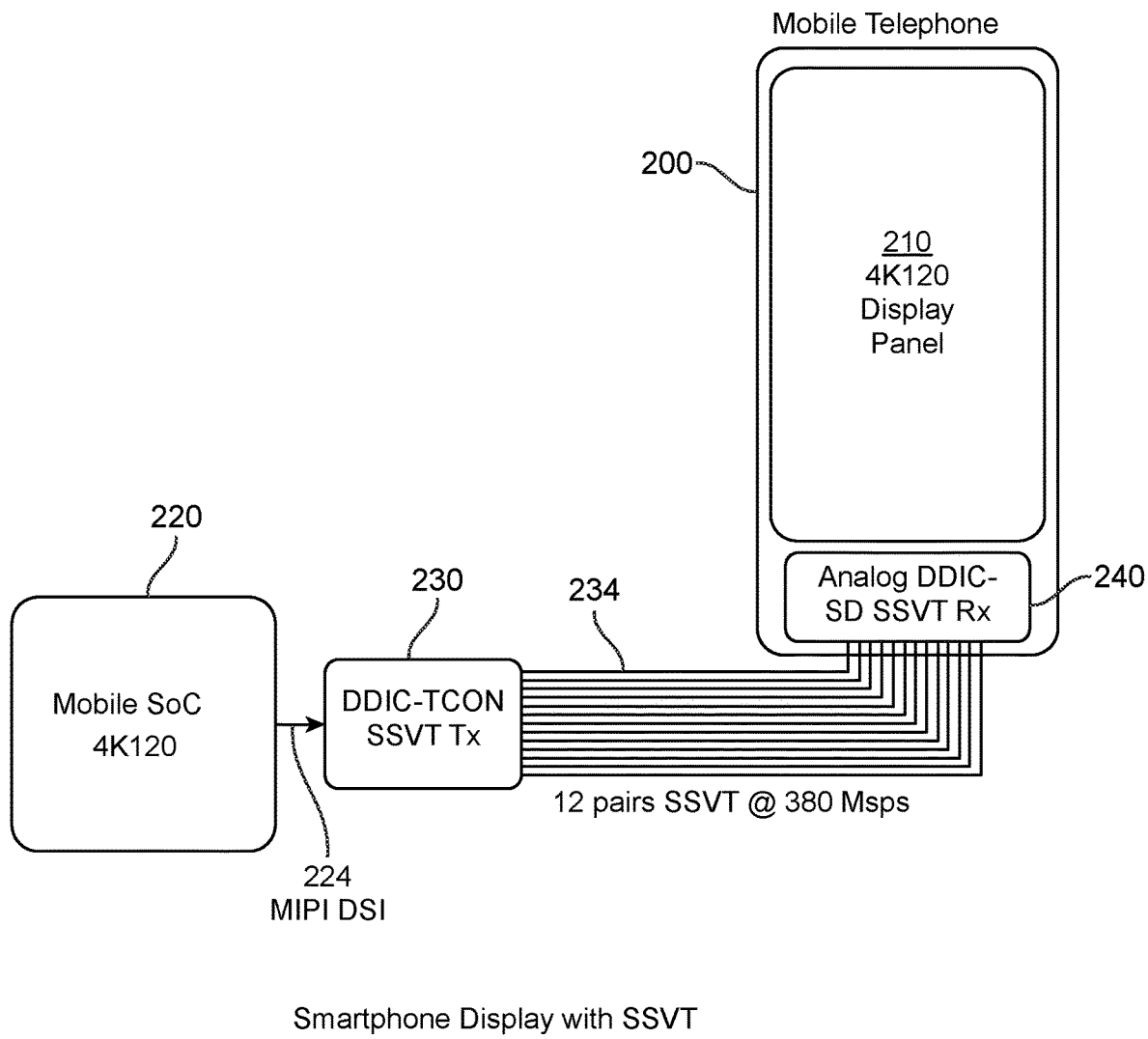
FIG. 17 is a block diagram of transporting video samples within a mobile telephone.

FIG. 17 is a block diagram of transporting video samples within a mobile telephone. Prior art displays on existing OLED DDIC devices such as mobile telephones are in need of improvement due to the high refresh rate of 4K smartphone displays, the MIPI receiver, SRAM, digital image processing, and significant use of analog signals requiring approximately 1,000 digital-to-analog converters.

The SSVT receiver 240 described below may be implemented as shown in FIG. 3 and as described above, and may include twelve source drivers as described herein, and each of these source drivers may be implemented on the display panel glass 210 in the various embodiments disclosed herein.

A split OLED DDIC architecture as shown has the following advantages: enables optimal DDIC-TCON and DDIC-SD partitioning; provides a short distance MIPI transmission from the SoC; optimizes the digital DDIC-TCON for SRAM and image processing; provides a simplified DDIC which is all analog; and only requires a small number of digital-to-analog converters in DDIC-TCON integrated with the SSVT transmitter.

Shown is a mobile telephone (or smartphone) 200 which may be any similar handheld, mobile device used for communication and display of images or video. Device 200 includes a display panel 210, a traditional mobile SoC 220, an integrated DDIC-TCON (Display Driver IC-Timing Controller) and SSVT transmitter module 230, and an integrated analog DDIC-SD (DDIC-source driver) and SSVT receiver 240. Mobile SoC 220 and module 230 are shown external to the mobile telephone for ease of explanation although they are internal components of the telephone.

Mobile SoC 220 is any standard SoC used in mobile devices and delivers digital video samples via MIPI DSI 224 (Mobile Industry Processor Interface Display Serial Interface) to the module 230 in a manner similar to Vx1 input signals discussed above. Included within module 230 is the DDIC-TCON integrated with an SSVT transmitter. Upon a reading of this disclosure and with reference to the previous drawings, one of skill in the art will understand how to implement the SSVT transmitter in order to output any number of analog SSVT signals 234. In this example, the SSVT transmitter outputs 12 pairs of SSVT signals at 380 Msps. Not shown are the timing and framing controls signals from module 230 to the gate drivers of display panel 210. Typically, for a mobile telephone, the DDICs are located at the bottom narrow edge of the telephone while the SoC is about in the middle of the device. Accordingly, the integrated DDIC-TCON/SSVT transmitter is located close to the SoC, within about 10 cm or less, or even about 1-2 centimeters or less. Since the transmission of digital data is at extreme frequencies, it is advantageous to keep the conductor lengths as short as possible. For a tablet computer, the distance is about 25-30 cm or less.

These analog SSVT signals received at the integrated analog DDIC-SD and SSVT receiver 240. A description of how to integrate a source driver with an SSVT receiver in order to receive any number of analog SSVT signals and to generate voltages for driving a display panel may be found herein and in application Ser. No. 17/900,570 referenced above. Advantageously, module 240 does not need any digital-to-analog converters.

Analog DDIC-SD Rx 240 may be a single integrated circuit having 12 source drivers within it (each handling a single pair) or may be 12 discrete integrated circuits each being a source driver and handling one of the 12 signal pairs.

SSVT Signal, Encoding and Decoding

As mentioned earlier, various embodiments of the present invention disclose that an encoded analog signal be used to transport video information within a display unit (or to a display unit) in order to dispense with the need for DACs within the source drivers, and to integrate the source drivers (or portions thereof) onto the display panel glass, among other advantages.

For the purposes of this disclosure, an electromagnetic signal (EM signal) is a variable represented as electromagnetic energy whose amplitude changes over time. EM signals propagate through EM paths, such as a wire pair (or cable), free space (or wireless) and optical or waveguide (fiber), from a transmitter terminal to a receiver terminal. EM signals can be characterized as continuous or discrete independently in each of two dimensions, time and amplitude. "Pure analog" signals are continuous-time, continuous-amplitude EM signals; "digital" signals are discrete-time, discrete-amplitude EM signals; and "sampled analog" signals are discrete-time, continuous-amplitude EM signals. The present disclosure discloses a novel discrete-time, continuous-amplitude EM signal termed a "spread-spectrum video transport" (SSVT) signal that is an improvement over existing SSDS-CDMA signals. SSVT refers to the transmission of electromagnetic signals over an EM pathway or pathways using an improved spread-spectrum direct sequence (SSDS)-based modulation.

Code Division Multiple Access (CDMA) is a well-known channel access protocol that is commonly used for radio communication technologies, including cellular telephony. CDMA is an example of multiple access, wherein several different transmitters can send information simultaneously over a single communication channel, In telecommunications applications, CDMA allows multiple users to share a given frequency hand without interference from other users. CDMA employs Spread Spectrum Direct Sequence (SSDS) encoding which relies on unique codes to encode each user's data. By using unique codes, the transmission of the multiple users can be combined and sent without interference between the users. On the receive side, the same unique codes are used for each user to demodulate the transmission, recovering the data of each user respectively.

An SSVT signal is different from CDMA. As a stream of input video (for example) samples is received at encoders, they are encoded by applying an SSDS-based modulation to each of multiple encoder input vectors to generate the SSVT signals. The SSVT signals are then transmitted over a transmission medium. On the receive side, the incoming SSVT signals are decoded by applying the corresponding SSDS-based demodulation in order to reconstruct the samples that were encoded. As a result, the original stream of time-ordered video samples containing color and pixel-related information is conveyed from a single video source to a single video sink, unlike CDMA which delivers data from multiple users to multiple receivers.

Figure 12:
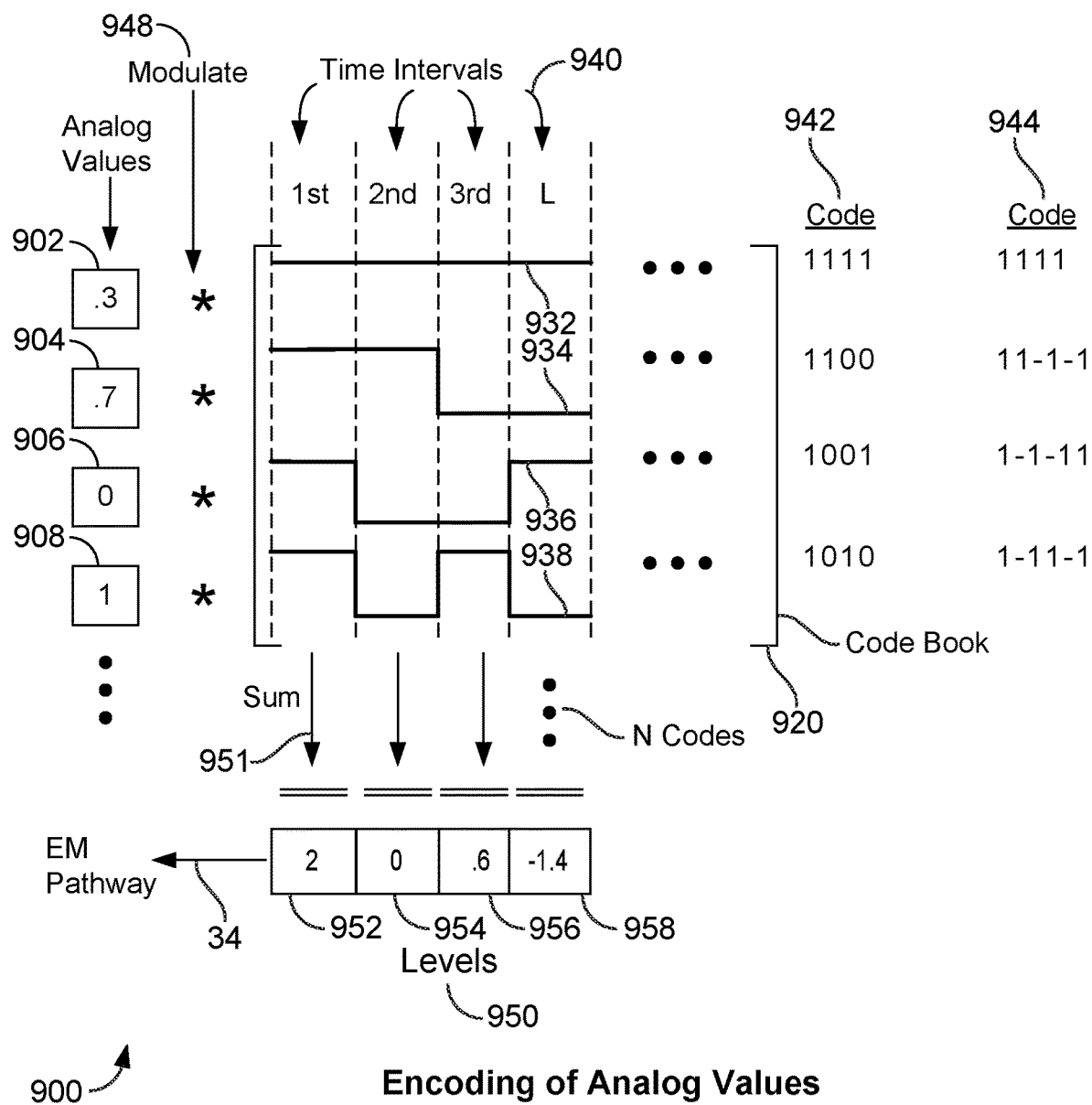
FIG. 12 illustrates how analog values are encoded within an encoder and then sent over an electromagnetic pathway.

FIG. 12 illustrates a simplistic example showing how signal samples, in this case, analog values, are encoded within an encoder and then sent over an electromagnetic pathway. Shown is an input vector of N analog values 902-908 which represent voltages of individual pixels within a video frame. These voltages may represent luminosity of a black-and-white image or luminosity of a particular color value in a pixel, e.g., an R, G or B color value of the pixel, i.e., each value represents a sensed or measured amount of light in the designated color space. Although pixel voltages are used in this example, this encoding technique may be used with voltages representing any of a variety of signals from a sensor such as LIDAR values, sound values, haptic values, aerosol values, etc., and the analog values may represent other samples such as current, etc. Signal samples that are digital values may also be encoded and this digital encoding is explained below. Further, even though one encoder and one EM pathway is shown, an embodiment of the invention works well with multiple encoders, each transmitting over an EM pathway.

Preferably, the range of these voltages is from 0 to 1 V for efficiency, although a different range is possible. These voltages typically are taken from pixels in a row of a frame in a particular order, but another convention may be used to select and order these pixels. Whichever convention is used to select these pixels and to order them for encoding, that same convention will be used at the receiving end by the decoder in order to decode these voltages in the same order and then to place them in the resulting frame where they belong. By the same token, if the frame is in color and uses RGB, the convention in this encoder may be that all of the R pixel voltages are encoded first, and then the G and B voltages, or the convention may be that voltages 902-906 are the RGB values of a pixel in that row and that the next three voltages 908-912 represent the RGB values of the next pixel, etc. Again, the same convention used by this encoder to order and encode voltages will be used by the decoder at the receiving end. Any particular convention for ordering analog values 902-908 (whether by color value, by row, etc.) may be used as long as the decoder uses the same convention. As shown, any number of N analog values 902-908 may be presented for encoding at a time using code book 920, limited only by the number of entries in the code book.

As mentioned, code book 920 has any number of N codes 932-938; in this simple example, the code book has four codes meaning that four analog values 902-908 are encoded at a time. A greater number of codes such as 127 codes, 255 codes, etc., may be used, but due to practical considerations such as circuit complexity, fewer codes are preferably used. As known in the art, code book 920 includes N mutually-orthogonal codes each of length L; in this example L =4. Typically, each code is an SSDS code, but need not necessarily be a spreading code as discussed herein. As shown, each code is divided into L time intervals (also called "chips") and each time interval includes a binary value for that code. As shown at code representation 942, code 934 may be represented in the traditional binary form "1100", although that same code may also be represented as "1 1 −1 −1" as shown in code representation 944 for ease-of-use in modulating the value as will be explained below. Codes 932 and 936-938 may also be represented as in 942 or in 944. Note that each code of length L is not associated with a different computing device (such as a telephone), a different person or a different transmitter, as is done in CDMA.

Therefore, in order to send the four analog values 902-908 over a transmission medium 34 to a receiver (with a corresponding decoder) the following technique is used. Each analog value will be modulated by each chip in the representation 944 of its corresponding code; e.g., value 902, namely .3, is modulated 948 by each chip in the representation 944 of code 932 sequentially in time. Modulation 948 may be the multiplication operator. Thus, modulating .3 by code 932 results in the series ".3, .3, .3, .3". Modulating .7 by code 934 becomes ".7, .7, −.7, −.7"; value "0" becomes "0, 0, 0, 0"; and value "1" becomes "1, −1, 1, −1". Typically, the first chip of each code modulates its corresponding analog value, and then the next chip of each code modulates its analog value, although an implementation may also modulate a particular analog value by all the chips of its code before moving on to the next analog value.

Each time interval, the modulated analog values are then summed at 951 (perceived vertically in this drawing) to obtain analog output levels 952-958; e.g., the summation of modulated values for these time intervals results in output levels of 2, 0, .6, −1.4. These analog output levels 952-958 may be further normalized or amplified to align with a transmission line's voltage restrictions and may then be sent sequentially in time as they are produced over an electromagnetic pathway (such as a differential twisted pair) of transmission medium 34 in that order. A receiver then receives those output levels 952-958 in that order and then decodes them using the same code book 920 using the reverse of the encoding scheme shown here. The resultant pixel voltages 902-908 may then be displayed in a frame of a display at the receiving end in accordance with the convention used. Thus, analog values 902-908 are effectively encoded synchronously and sent over a single electromagnetic pathway in a sequential series of L analog output levels 952-958. Numerous encoders and electromagnetic pathways may also be used as shown and described herein. Further, the number of N samples that can be encoded in this manner depends upon the number of orthogonal codes used in the code book.

Advantageously, even though the use of robust SSDS techniques (such as spreading codes) results in a significant drop in bandwidth, the use of mutually-orthogonal codes, the modulation of each sample by chips of its corresponding code, summation, and the transmission of N samples in parallel using L output levels results in a significant bandwidth gain. In contrast with traditional CDMA techniques in which binary digits are encoded serially and then summed, the present invention first modulates the entire sample (i.e., the entire analog or digital value, not a single bit) by each chip in a corresponding code, and then sums those modulations at each time interval of the codes to obtain a resultant analog voltage level for each particular time interval, thus exploiting the amplitude of the resultant waveform. It is these analog output levels that are sent over a transmission medium, not representations of binary digits. Further, the present invention facilitates sending analog voltages from one video source to another video sink, i.e., from endpoint to endpoint, unlike CDMA techniques which allow for multiple access by different people, different devices or different sources, and send to multiple sinks. Moreover, compression is not required for the transport of the sample values.

Figure 13:
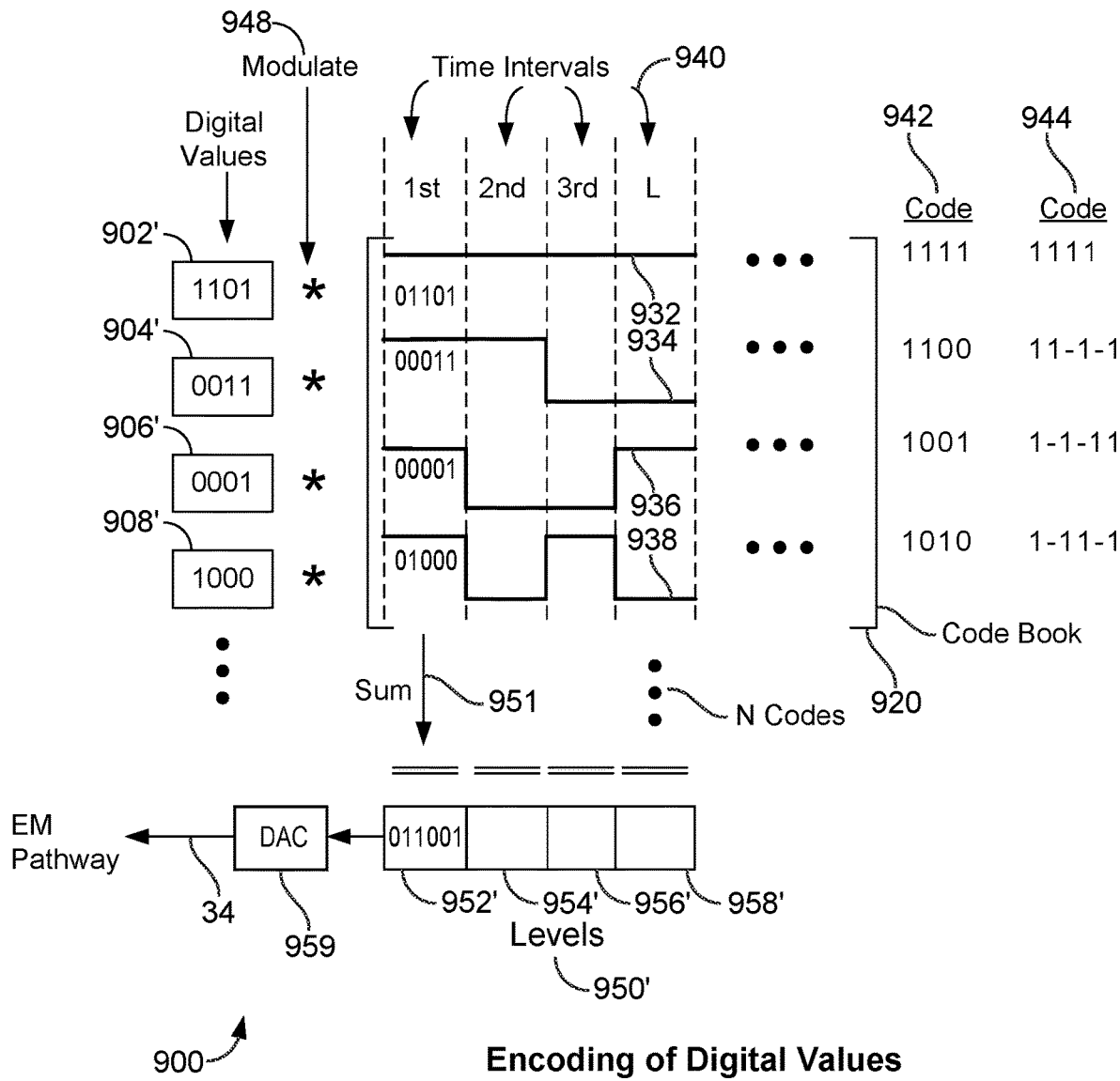
FIG. 13 illustrates a novel encoding technique as being applicable to signal samples that are digital values.

FIG. 13 illustrates this novel encoding technique as being applicable to signal samples that are digital values. Here, digital values 902'-908' are digital representations of voltages. Using a different example of voltages, value 902' is "1101" value 904' is "0011," value 906' is "0001," and value 908' is "1000." Each digital value is modulated (digitally multiplied) by the representation 944 of each code, that is by "1" or by "−1" depending upon the chip of the code corresponding to the digital value to be modulated. Considering only the first time interval 940 of each code, and adding a most significant bit (MSB) which is the sign bit, modulating "1101" yields "01101" (the MSB "0" meaning a positive value), modulating "0011" yields "00011", modulating "0001" yields "00001," and modulating "1000" yields "01000." These modulated values are shown annotated on the first time interval. (Although not shown, modulating by a −1 chip yields a negative value which may be expressed in binary using a suitable binary representation for negative values.)

Summing digitally, these modulated values in the first time interval yields digital value 952' "011001" (again, the MSB is the sign bit); the other digital values 954'-958' are not shown in this example, but are calculated in the same way. Considering this summation in base 10, one can verify that the modulated values 13, 3, 1 and 8 do sum to 25. Although not shown in this example, typically additional MSBs will be available for the resultant levels 952'-958' in that the sum may require more than five bits. For example, if values 902'-908' are represented using four bits, then levels 952'-958' may be represented using up to ten bits, in the case where there are 64 codes (adding log2 of 64 bits). Or, if 32 modulated values are summed then five more bits will be added. The number of bits needed for the output levels will depend upon the number of codes.

The output levels 950' may be first normalized to adjust to the DAC's input requirements and then fed sequentially into a DAC 959 for conversion of each digital value into its corresponding analog value for transmission over the EM pathway. DAC 959 may be a MAX5857 RF DAC (includes a clock multiplying PLL/VCO and a 14-bit RF DAC core, and the complex path may be bypassed to access the RF DAC core directly), and may be followed by a bandpass filter and then a variable gain amplifier (VGA), not shown. In some situations the number of bits used in levels 950' are greater than the number allowed by DAC 959, e.g., level 952' is represented by ten bits but DAC 959 is an 8-bit DAC. In these situations, the appropriate number of LSBs are discarded and the remaining MSBs are processed by the DAC, with no loss in the visual quality of the resultant image at the display.

Advantageously, entire digital values are modulated, and then these entire modulated digital values are summed digitally to produce a digital output level for conversion and transmission. This technique is different from CDMA which modulates each binary digit of a digital value and then sums these modulated bits to produce outputs. For example, assuming that there are B bits in each digital value, with CDMA, there will be a total of B*L output levels to send, whereas with this novel digital (or analog) encoding technique there will only be a total of L output levels to send, thus having an advantage.

Figure 14:
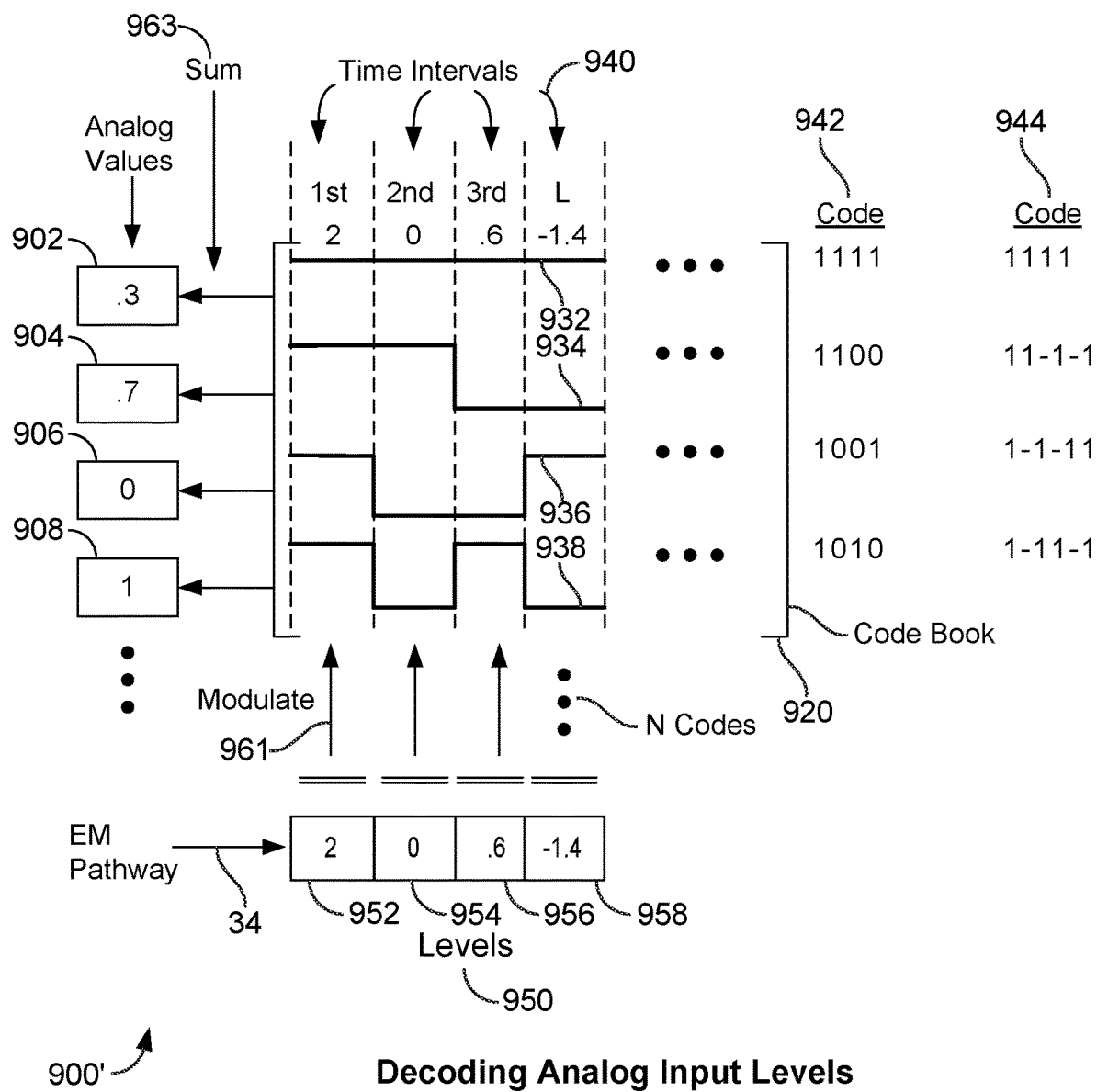
FIG. 14 illustrates the decoding of analog input levels that were encoded using the encoder of FIG. 12.

FIG. 14 illustrates the decoding of analog input levels that were encoded using the encoder of FIG. 12. As shown, L input levels 950 have been received over a single electromagnetic pathway of a transmission medium 34. As described herein and noted earlier, code book 920 includes N orthogonal codes 932-938 that will be used to decode input levels 950 to produce an output vector of N analog values 902-908, i.e., the same analog values 902-908 that were encoded above. To perform decoding, as indicated by the vertical arrows, each input level 952-958 is modulated 961 by each chip of each code corresponding to a particular index in the output vector 902-908. Considering modulation of levels 952-958 by the first code 932, such modulation produces the series of modulated values "2, 0, .6, −1.4". Modulation of levels 952-958 by the second code 934 produces the series of modulated values "2, 0, −.6, 1.4". Modulation by the third code 936 produces "2, 0, −.6, −1.4", and modulation by the fourth code 938 produces "2, 0, .6, 1.4".

Next, as indicated by the horizontal arrows, each series of modulated values is summed in order to produce one of the analog values 902-908. For example, the first series is summed to produce the analog value "1.2" (which becomes ".3" after being normalized using the scale factor of '4). In a similar fashion, the other three series of modulated values are summed to produce the analog values "2.8", "0" and "4", and after being normalized yield the output vector of analog values 902-908. Each code may modulate the input levels and then that series may be summed, or, all may modulate the input levels before each series is summed Thus, the output vector of N analog values 902-908 has been transported in parallel using L output levels.

Not shown in these examples is an example of decoding digital input levels, although one of skill in the art will find it straightforward to perform such decoding upon reading the encoding of digital values in the above description.

Figure 15A:
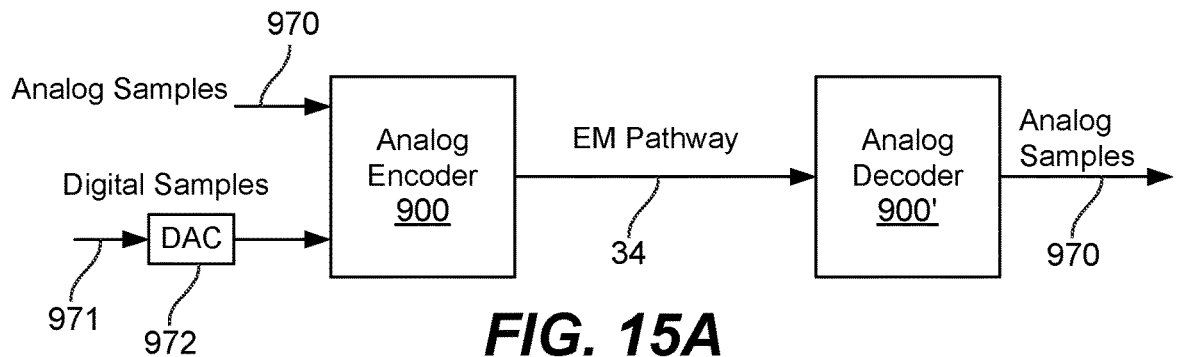
FIG. 15A illustrates use of an analog encoder and a corresponding analog decoder.
Figure 15B:
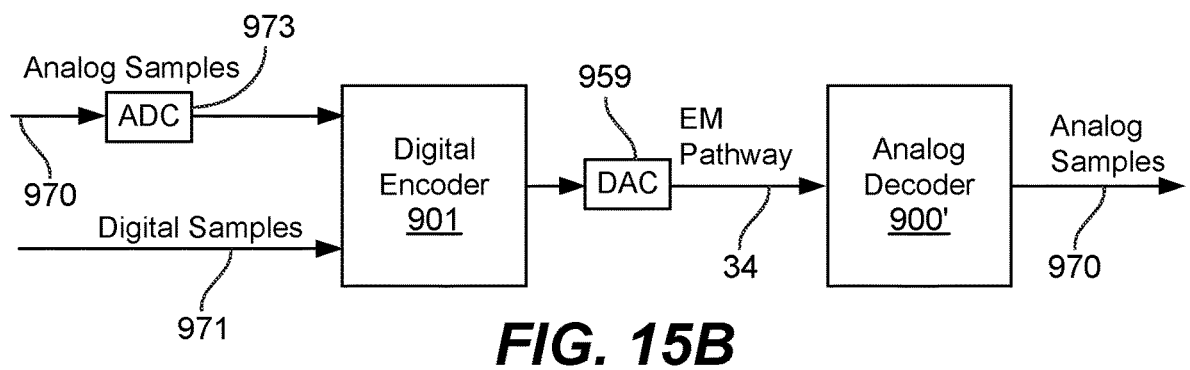
FIG. 15B illustrates use of a digital encoder and a corresponding analog decoder.
Figure 15C:
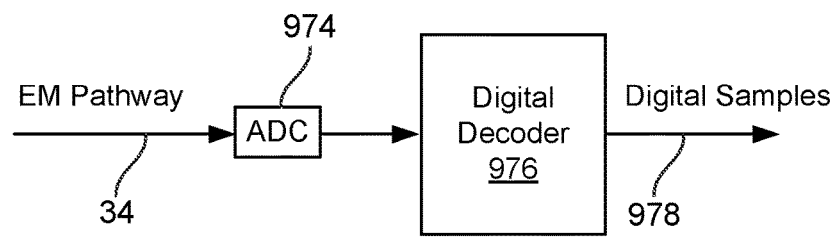
FIG. 15C illustrates use of a digital decoder to decode encoded analog signals that have arrived over an electromagnetic pathway on a transmission medium.

FIGS. 15A, 15B and 15C illustrate that the encoders and decoders may operate upon either analog samples or digital samples; the various analog and digital encoders and decoders have previously been described above. As explained above, there may be more than one EM pathway and accordingly more than one encoder/decoder pair and a corresponding number of DACs or ADCs as the case may be.

FIG. 15A illustrates use of an analog encoder and a corresponding analog decoder. Input into analog encoder 900 are either analog samples 970 or digital samples 971 that have been converted into analog by a DAC 972 located at the analog encoder. In this fashion, either analog or digital samples that arrive at the analog encoder may be encoded for transmission over an electromagnetic pathway on transmission medium 34. Analog decoder 900' decodes the encoded analog samples to produce analog samples 970 for output. Analog samples 970 may be used as is or may be converted into digital samples using an ADC (not shown).

FIG. 15B illustrates use of a digital encoder and a corresponding analog decoder. Input into digital encoder 901 are either digital samples 971 or analog samples 970 that have been converted into digital by an ADC 973 located at the digital encoder. As the encoder is digital, a DAC 959 located at the encoder converts the encoded samples into analog before transmission over the electromagnetic pathway. In this fashion, either analog or digital samples that arrive at the digital encoder may be encoded for transmission over an electromagnetic pathway on transmission medium 34. Analog decoder 900' decodes the encoded analog samples to produce analog samples 970 for output. Analog samples 970 may be used as is or may be converted into digital samples using an ADC (not shown).

FIG. 15C illustrates use of a digital decoder to decode encoded analog signals that have arrived over an electromagnetic pathway on transmission medium 34. The encoded analog signals may be transmitted using either the analog encoder or the digital encoder described immediately above. An ADC 974 located at digital decoder 976 receives the encoded analog samples sent via the electromagnetic pathway and converts the samples into digital. These encoded digital samples are then decoded by digital decoder 976 into digital samples 978 (corresponding to the values of an input vector of samples that was originally encoded before transmission over the electromagnetic pathway). Digital samples 978 may be used as is or may be converted into analog samples using a DAC.

Figure 16:
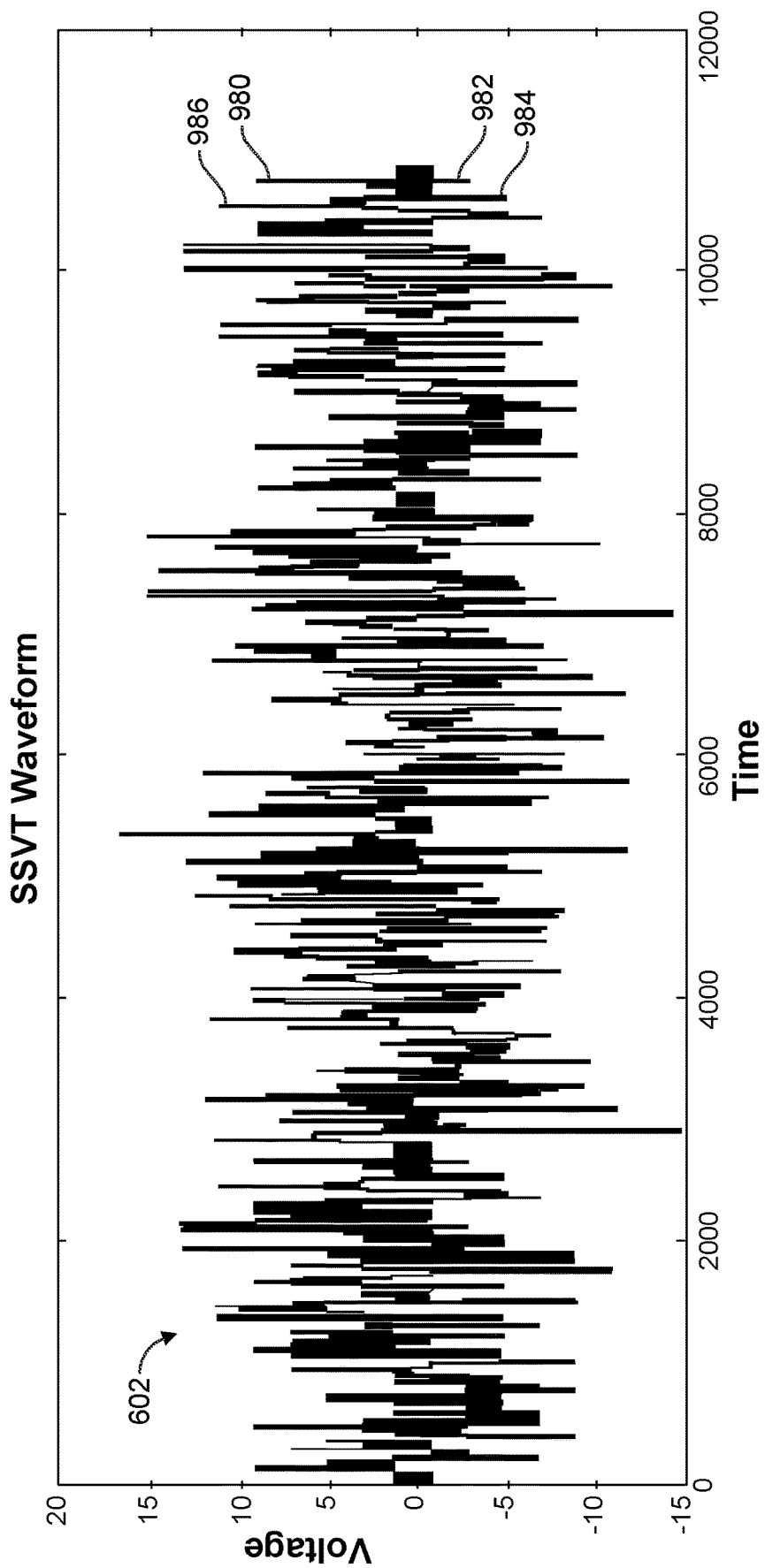
FIG. 16 shows a simulation of an SSVT waveform sent via an electromagnetic pathway.

FIG. 16 shows a simulation (similar to an idealized oscilloscope trace) of an SSVT waveform 602 sent via an electromagnetic pathway after being output from an analog encoder (or after being digitally encoded and then converted by a DAC). The vertical scale is voltage, and the horizontal scale is a 100 ps oscilloscope measurement time interval. Note that SSVT signal 602 is an analog waveform rather than a digital signal (i.e., the signal does not represent binary digits) and in this embodiment can transport a range of voltages from about −15 V up to about +15 V. The voltage values of the analog waveform are (or at least can be) fully analog. Also, voltages are not limited to some maximum value, although high values are impractical.

As previously explained, analog voltage levels are sent sequentially over an electromagnetic pathway, each level being the summation of modulated samples per time interval, such as the analog output levels 952-958 above or the digital output levels 952'-958' above (after being passed through a DAC). When sent, these output levels then appear as a waveform such as waveform 602. In particular, voltage level 980 represents the summation in a particular time interval of modulated samples (i.e., an output level). Using a simplistic example, sequential voltage levels 980-986 represent the transmission of four output levels. In this example, 32 codes are used, meaning that 32 samples may be transmitted in parallel; thus, voltage levels 980-986 (followed by a number of subsequent voltage levels, depending upon the number of chips in a code, L) form the transmission in parallel of 32 encoded samples (such as pixel voltages from a video source). Subsequent to that transmission, the next set of L voltage levels of waveform 602 represent the transmission of the next 32 samples. In general, waveform 602 represents the encoding of analog or digital values into analog output levels, and the transmission of those levels in discrete time intervals to form a composite analog waveform.

Due to such phenomena as attenuation, reflections due to impedance mismatches, and impinging aggressor signals, every electromagnetic pathway degrades electromagnetic signals that propagate through it, and thus measurements taken of input levels at a receiving terminal are always subject to error with respect to corresponding output levels made available at the transmitting terminal. Hence, scaling of input levels at a receiver (or normalization or amplification of output levels at a transmitter) may be performed to compensate, as is known in the art. Further, due to process gain (i.e., due to an increase in L which also increases electrical resilience) decoded input levels at a decoder are normalized by a scale factor using the code length to recover the transmitted output levels as is known in the art. Further, as herein described, although it is preferable that L>=N>=2, in some situations it is possible that L will be less than N, i.e., N>L>=2.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

I claim:

1. A source driver of a display unit comprising:
   a decoder that receives an analog signal representing a video stream of encoded sample values and outputs decoded sample values during a decoding interval;
   a collector that inputs said decoded sample values during a plurality of said decoding intervals and outputs a set of decoded sample values in parallel after said plurality of decoding intervals, said decoder and said collector being implemented outside an edge of a display panel of said display unit; and
   a plurality of amplifiers that input said set of decoded sample values and output voltages to pixels of said display panel, wherein said plurality of amplifiers being implemented using at least transistors on a glass substrate of said display panel.

2. A source driver as recited in claim 1 wherein said analog signal is an ordered sequence of continuous amplitude analog levels.

3. A source driver as recited in claim 1 wherein said plurality of amplifiers are located on said glass substrate of said display panel between said pixel display area and a perimeter of said glass substrate.

4. A source driver as recited in claim 1 wherein said source driver does not include a digital-to-analog converter for converting video samples.

5. A source driver as recited in claim 1 wherein said transistors are able to operate at a clock frequency required by said amplifiers.

6. A source driver as recited in claim 5 wherein said transistors are thin-film transistors (TFTs), and are either low-temperature poly-silicon (LTPS) transistors or are indium-gallium-zinc oxide (IGZO) transistors.

7. A source driver as recited in claim 1 wherein pixels of said display panel are implemented using the same type of transistors used to implement said amplifiers.

8. A source driver as recited in claim 1 wherein said display unit is a display of a mobile telephone.

9. A source driver as recited in claim 1 further comprising:
   a plurality of level shifters, each level shifter associated with one of said amplifiers and operating to shift said voltages, wherein said level shifters also being implemented using at least transistors on said glass substrate of said display panel and wherein said transistors are able to operate at a clock frequency required by said level shifters.

10. A source driver as recited in claim 1 wherein said collector is a two-stage collector.

11. A source driver of a display unit comprising:
    at least one decoder that receives an analog signal representing a video stream of encoded sample values and outputs decoded sample values during a decoding interval, said decoder being implemented outside an edge of a display panel of said display unit;
    a collector that inputs said decoded sample values during a plurality of said decoding intervals and outputs a set of decoded sample values after said plurality of decoding intervals; and
    a plurality of amplifiers that input said set of decoded sample values and output voltages to pixels of said display panel, wherein said collector and said amplifiers being implemented using at least transistors on a glass substrate of said display panel.

12. A source driver as recited in claim 11 wherein said analog signal is an ordered sequence of continuous amplitude analog levels.

13. A source driver as recited in claim 11 wherein said collector and said amplifiers are located on said glass substrate of said display panel between said pixel display area and a perimeter of said glass substrate.

14. A source driver as recited in claim 11 wherein said source driver does not include a digital-to-analog converter for converting video samples.

15. A source driver as recited in claim 11 wherein said transistors are able to operate at a first clock frequency required by said amplifiers and at a second clock frequency required by said collector.

16. A source driver as recited in claim 15 wherein said transistors are thin-film transistors (TFTs), and are either low--temperature poly-silicon (LTPS) transistors or are indium-gain - um-zinc oxide (IGZO) transistors.

17. A source driver as recited in claim 11 wherein pixels of said display panel are implemented using the same type of transistors used to implement said collector and said amplifiers.

18. A source driver as recited in claim 11 wherein said display unit is a display of a mobile telephone.

19. A source driver as recited in claim 11 further comprising:
a plurality of level shifters, each level shifter associated with one of said amplifiers and operating to shift said voltages, wherein said level shifters also being implemented using at least transistors on said glass substrate of said display panel and wherein said transistors are able to operate at a clock frequency required by said level shifters.

20. A source driver as recited in claim 11 wherein said collector is a two-stage collector.

21. A source driver of a display unit comprising:
at least one decoder that receives an analog signal representing a video stream of encoded sample values and outputs decoded sample values during a decoding interval;
a collector that inputs said decoded sample values during a plurality of said decoding intervals and outputs a set of decoded sample values after said plurality of decoding intervals; and
a plurality of amplifiers that input said set of decoded sample values and output voltages to pixels of said display panel, wherein said decoder, said collector and said amplifiers being implemented using at least transistors on a glass substrate of said display panel.

22. A source driver as recited in claim 21 wherein said analog signal is an ordered sequence of continuous amplitude analog levels.

23. A source driver as recited in claim 21 wherein said decoder, said collector and said amplifiers are located on said glass of said display panel between said pixel display area and a perimeter of said glass.

24. A source driver as recited in claim 21 wherein said source driver does not include a digital-to-analog converter for converting video samples.

25. A source driver as recited in claim 21 wherein said transistors are able to operate at a first clock frequency required by said amplifiers, at a second clock frequency required by said collector, and at a third clock frequency required by said decoder.

26. A source driver as recited in claim 25 wherein said transistors are thin-film indium-gallium-zinc oxide (IGZO) transistors.

27. A source driver as recited in claim 21 wherein pixels of said display panel are implemented using the same type of transistors used to implement said amplifiers, said collector and said decoder.

28. A source driver as recited in claim 21 wherein said display unit is a display of a mobile telephone.

29. A source driver as recited in claim 21 further comprising:
a plurality of level shifters, each level shifter associated with one of said amplifiers and operating to shift said voltages, wherein said level shifters also being implemented using at least transistors on said glass substrate of said display panel and wherein said transistors are able to operate at a clock frequency required by said level shifters.

30. A source driver as recited in claim 21 wherein said collector is a two-stage collector.

31. A display unit comprising:
a display panel having a glass substrate; and
a plurality of source drivers, each source driver including
a decoder that receives an analog signal representing a video stream of encoded sample values and outputs decoded sample values during a decoding interval,
a collector that inputs said decoded sample values during a plurality of said decoding intervals and outputs a set of decoded sample values after said plurality of decoding intervals; and
a plurality of amplifiers that input said set of decoded sample values and output voltages to pixels of said display panel.

32. A display unit as recited in claim 31 wherein said decoder and said collector are implemented outside an edge of said display panel of said display unit, wherein said amplifiers are implemented using at least transistors on said glass substrate of said display panel, and wherein said transistors are able to operate at a clock frequency required by said amplifiers.

33. A display unit as recited in claim 32 wherein said plurality of amplifiers are located on said glass substrate of said display panel between said pixel display area and a perimeter of said glass substrate.

34. A display unit as recited in claim 32 wherein said transistors are thin-film transistors (TFTs), and are either low-temperature poly-silicon (LTPS) transistors or are indium-gallium-zinc oxide (EGZO) transistors.

35. A display unit as recited in claim 32 wherein pixels of said display panel are implemented using the same type of transistors used to implement said amplifiers.

36. A display unit as recited in claim 31 wherein said decoder is implemented outside an edge of said display panel of said display unit and wherein said collector and said amplifiers are implemented using at least transistors on said glass substrate of said display panel, and wherein said transistors are able to operate at clock frequencies required by said collector and by said amplifiers.

37. A display unit as recited in claim 36 wherein said transistors are thin-film indium-gallium-zinc oxide (IGZO) transistors.

38. A display unit as recited in claim 31 wherein said decoder, said collector and said amplifiers are implemented using at least transistors on said glass substrate of said display panel, and wherein said transistors are able to operate at clock frequencies required by said decoder, by said collector and by said amplifiers.

39. A display unit as recited in claim 38 wherein said transistors are thin-film transistors (TFTs), and are either low-temperature poly-silicon (LTPS) transistors or are indium-gallium-zinc oxide (IGZO) transistors.

40. A display unit as recited in claim 31 wherein said analog signal is an ordered sequence of continuous amplitude analog levels.

41. A display unit as recited in claim 31 wherein said source driver does not include a digital-to-analog converter for converting video samples.

42. A display unit as recited in claim 31 wherein said display unit is a display of a mobile telephone.

43. A display unit as recited in claim 32 further comprising:
   a plurality of level shifters, each level shifter associated with one of said amplifiers and operating to shift said voltages, wherein said level shifters also being implemented using at least transistors on said glass substrate of said display panel and wherein said transistors are able to operate at a clock frequency required by said level shifters.

44. A display unit as recited in claim 31 wherein said collector is a two-stage collector.

\* \* \* \* \*